(12) United States Patent
Hyun et al.

(10) Patent No.: US 12,538,658 B2
(45) Date of Patent: Jan. 27, 2026

(54) DISPLAY DEVICE

(71) Applicant: Samsung Display Co., Ltd., Yongin-si (KR)

(72) Inventors: Jinho Hyun, Gwacheon-si (KR);
Heechang Yoon, Anyang-si (KR);
Hyoung Sub Lee, Yongin-si (KR);
Hyemin Lee, Gimpo-si (KR); Woo Yong Sung, Seoul (KR); Seungyong Song, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 732 days.

(21) Appl. No.: 17/886,793

(22) Filed: Aug. 12, 2022

(65) Prior Publication Data

US 2023/0122827 A1    Apr. 20, 2023

(30) Foreign Application Priority Data

Oct. 15, 2021  (KR) ........................ 10-2021-0137924

(51) Int. Cl.
*H10K 59/122*   (2023.01)
*H10K 50/86*    (2023.01)
*H10K 59/30*    (2023.01)

(52) U.S. Cl.
CPC ......... *H10K 59/122* (2023.02); *H10K 50/865* (2023.02); *H10K 59/30* (2023.02)

(58) Field of Classification Search
CPC .. H10K 59/122; H10K 59/123; H10K 59/173; H10K 59/124; H10K 50/865; H10K 50/8428; H10K 50/844–8445; H10K 50/00–88; H10K 59/00–95; H10K 2102/00–361; G02F 1/1339; G02F 2001/13398

See application file for complete search history.

(56) References Cited

U.S. PATENT DOCUMENTS

| 8,367,278 B2 | 2/2013 | Kwon et al. | |
| 2017/0373124 A1* | 12/2017 | Yang | H10D 86/441 |
| 2019/0165060 A1* | 5/2019 | Choi | H10K 59/8723 |

(Continued)

FOREIGN PATENT DOCUMENTS

| KR | 10-1073293 B1 | 10/2011 |
| KR | 1020200063379 A | 6/2020 |
| KR | 1020210010597 A | 1/2021 |

*Primary Examiner* — Steven B Gauthier
*Assistant Examiner* — Adam D Weiland
(74) *Attorney, Agent, or Firm* — CANTOR COLBURN LLP

(57) ABSTRACT

A display device includes a first region including a first light emitting element including a first electrode, a second region including a second light emitting element including a second electrode, a pixel defining layer including a first sidewall defining a first opening corresponding to the first electrode and a second sidewall defining a second opening corresponding to the second electrode, a first spacer which protrudes from the pixel defining layer in the first region and includes a first edge closest to the first opening, and a second spacer which protrudes from the pixel defining layer in the second region and includes a second edge closest to the second opening. A distance between the first sidewall and the first edge, is smaller than a distance between the second sidewall and the second edge.

20 Claims, 17 Drawing Sheets

(56) References Cited

U.S. PATENT DOCUMENTS

| | | | |
|---|---|---|---|
| 2019/0341428 A1* | 11/2019 | Lee | H10K 50/125 |
| 2020/0052051 A1* | 2/2020 | Lee | G06F 1/1686 |
| 2020/0170126 A1 | 5/2020 | Ahn et al. | |
| 2021/0005845 A1 | 1/2021 | Kim et al. | |

* cited by examiner

DISPLAY DEVICE

This application claims priority to Korean Patent Application No. 10-2021-0137924 filed on Oct. 15, 2021, and all the benefits accruing therefrom under 35 U.S.C. § 119, the disclosures of which are incorporated by reference herein in their entireties.

BACKGROUND

(1) Field

Embodiments of the present disclosure described herein relate to a display device with improved product reliability.

(2) Description of the Related Art

Various display devices used in a multimedia device such as a television, a mobile phone, a tablet computer, a navigation, a game console, or the like have been developed. Research for reducing a region that does not display an image in the display device is being conducted in response to a market demand. At the same time, research for expanding a display region where the image is displayed in the display device is being conducted.

SUMMARY

Embodiments of the present disclosure provide a display device in which a film lifting phenomenon or a film shape deformation caused by an external stress is reduced.

Embodiments of the present disclosure provide a display device in which flatness is improved to reduce or remove stain defects.

According to an embodiment, a display device includes a display panel including a first region and a second region, a first light emitting element in the first region and including a first pixel electrode, a second light emitting element in the second region and including a second pixel electrode, a pixel defining film defining a first opening overlapping a portion of the first pixel electrode and a second opening overlapping a portion of the second pixel electrode, a first spacer in the first region and on the pixel defining film, and a second spacer in the second region and on the pixel defining film, and when viewed on a plane (e.g., in a plan view), a distance between a first sidewall of the pixel defining film defining the first opening, and an edge of the first spacer, is smaller than a distance between a second sidewall of the pixel defining film defining the second opening, and an edge of the second spacer.

The pixel defining film may include a first pixel defining portion overlapping the first region and a second pixel defining portion overlapping the second region, and, when viewed on a plane, a ratio of an area of a portion of the first pixel defining portion overlapping the first spacer to a total area of the first pixel defining portion, may be greater than a ratio of an area of a portion of the second pixel defining portion overlapping the second spacer to a total area of the second pixel defining portion.

The first spacer may include a first protruding portion of a first height and a first additional protruding portion protruding from a top surface of the first protruding portion, and the edge of the first spacer may be an edge of the first protruding portion.

A first spacer opening overlapping with the first opening of the pixel defining film may be defined in the first protruding portion, and the first spacer opening may be larger than the first opening.

The second spacer may include a second protruding portion of a second height and a second additional protruding portion protruding from a top surface of the second protruding portion, and the edge of the second spacer may be an edge of the second protruding portion.

The second height may be smaller than the first height.

A second spacer opening overlapping the second opening of the pixel defining film may be defined in the second protruding portion, and the second spacer opening may be larger than the second opening.

The second spacer opening may be larger than the first spacer opening.

The first additional protruding portion and the second additional protruding portion may respectively include a plurality of first additional protruding portions and a plurality of second additional protruding portions, the plurality of first additional protruding portions may be arranged to be spaced apart from each other, and the plurality of second additional protruding portions may be arranged to be spaced apart from each other.

The second spacer may include a plurality of second spacers, and the plurality of second spacers may be arranged to be spaced apart from each other.

A height of each of the plurality of second spacers may be greater than the first height.

The first region may include a front surface display region, a first side surface display region bent from a first side of the front surface display region and a second side surface display region bent from a second side of the front surface display region, and the second region may be a corner display region between the first side surface display region and the second side surface display region.

The display panel may further include a first dam in the first region, a plurality of second dams in the second region, a first organic encapsulation layer for covering the first region, where the first organic encapsulation layer is in a region surrounded by the first dam, and a plurality of second organic encapsulation layers in the second region, where the plurality of second organic encapsulation layers are in regions surrounded by the plurality of second dams, respectively.

A thickness of the first organic encapsulation layer may be greater than a thickness of each of the plurality of second organic encapsulation layers.

The display device may further include an anti-reflection layer on the display panel, where the anti-reflection layer may include a partitioned layer where a plurality of partitioning openings respectively corresponding to the first opening and the second opening are defined, and a plurality of color filters respectively corresponding to the plurality of partitioning openings, and a sensor layer between the display panel and the anti-reflection layer to sense an external input.

According to an embodiment, a display device includes a first region including a front surface display region, a first side surface display region bent from a first side of the front surface display region and a second side surface display region bent from a second side of the front surface display region, and a second region between the first side surface display region and the second side surface display region, and the display panel including a first light emitting element in the first region and including a first pixel electrode, a second light emitting element in the second region and including a second pixel electrode, a pixel defining film including a first pixel defining portion where a first opening overlapping a portion of the first pixel electrode is defined, where the first pixel defining portion is in the first region, and a second pixel defining portion where a second opening overlapping a portion of the second pixel electrode is defined, where the second pixel defining portion is in the second region, a first spacer in the first region and on the first pixel defining portion, and a second spacer in the second region and on the second pixel defining portion, and, when viewed on a plane, a ratio of an area of a portion of the first pixel defining portion overlapping the first spacer to a total area of the first pixel defining portion is greater than a ratio of an area of a portion of the second pixel defining portion overlapping the second spacer to a total area of the second pixel defining portion.

The first spacer may include a first protruding portion of a first height and a first additional protruding portion protruding from a top surface of the first protruding portion, a first spacer opening overlapping with the first opening of the first pixel defining portion may be defined in the first protruding portion, and the first spacer opening may be larger than each of the first opening and the first spacer opening.

The second spacer may include a second protruding portion of a second height and a second additional protruding portion protruding from a top surface of the second protruding portion, a second spacer opening overlapping the second opening of the second pixel defining portion may be defined in the second protruding portion, and the second spacer opening may be larger than the second opening.

The second height may be smaller than the first height.

The display panel may include a first dam in the first region, a plurality of second dams in the second region, a first organic encapsulation layer for covering the first region, where the first organic encapsulation layer is in a region surrounded by the first dam, and a plurality of second organic encapsulation layers in the second region, where the plurality of second organic encapsulation layers are in regions surrounded by the plurality of second dams, respectively, and a thickness of the first organic encapsulation layer may be greater than a thickness of each of the plurality of second organic encapsulation layers.

BRIEF DESCRIPTION OF THE FIGURES

The above and other objects and features of the present disclosure will become apparent by describing in detail embodiments thereof with reference to the accompanying drawings.

DETAILED DESCRIPTION

Figure 1A:
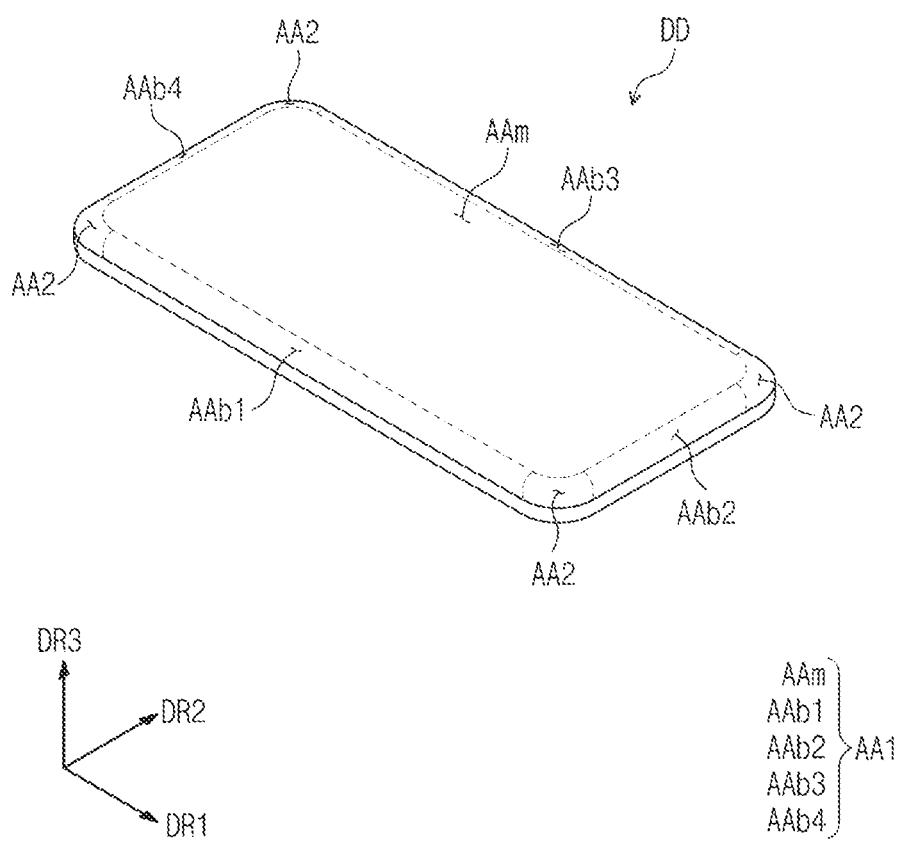
FIG. 1A is a perspective view of a display device according to an embodiment of the present disclosure.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

In the present specification, when a component (or a region, a layer, a portion, and the like) is referred to as being related to another element such as being "on", "connected to", or "coupled to" another component, it means that the component may be directly disposed/connected/coupled on another component or a third component may be disposed between the component and another component. In contrast, when a component (or a region, a layer, a portion, and the like) is referred to as being related to another element such as being "directly on", "directly connected to", or "directly coupled to" another component, it means that no third component is between the component and another component.

Like reference numerals refer to like components. In addition, in the drawings, thicknesses, ratios, and dimensions of components are exaggerated for effective description of technical content. As used herein, a reference number may indicate a singular element or a plurality of the element. For example, a reference number labeling a singular form of an element within the drawing figures may be used to reference a plurality of the singular element within the text of specification.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes all of one or more combinations that the associated components may define.

Terms such as first, second, and the like may be used to describe various components, but the components should not be limited by the terms. The above terms are used only for the purpose of distinguishing one component from another. For example, without departing from the scope of the present disclosure, a first component may be named as a second component, and similarly, the second component may also be named as the first component. The singular expression includes the plural expression unless the context clearly dictates otherwise.

In addition, terms such as "beneath", "below", "on", "above" are used to describe the relationship of the components shown in the drawings. The above terms are relative concepts, and are described with reference to directions indicated in the drawings. In the present specification, "disposed on" may refer to a case of being disposed not only on top of, but also beneath one member.

It should be understood that terms such as "include" or "have" are intended to specify that a feature, a number, a step, an operation, a component, a part, or a combination thereof described in the specification is present, and do not preclude a possibility of addition or existence of one or more other features or numbers, steps, operations, components, parts, or combinations thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms including technical and scientific terms used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the present disclosure will be described with reference to the drawings.

Figure 1B:
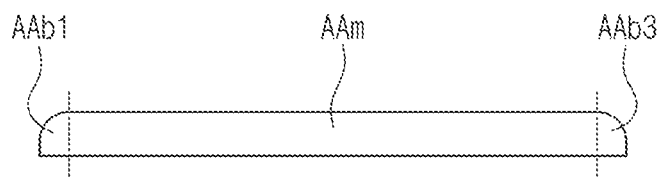
FIG. 1B is a side view of a display device shown in FIG. 1A.
Figure 1B:
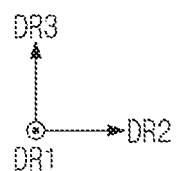
Figure 1C:
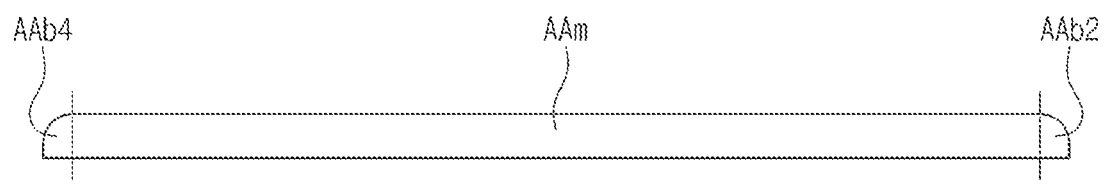
FIG. 1C is a side view of a display device shown in FIG. 1A.
Figure 1C:
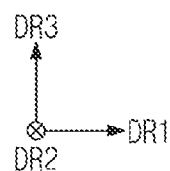
Figure 1D:
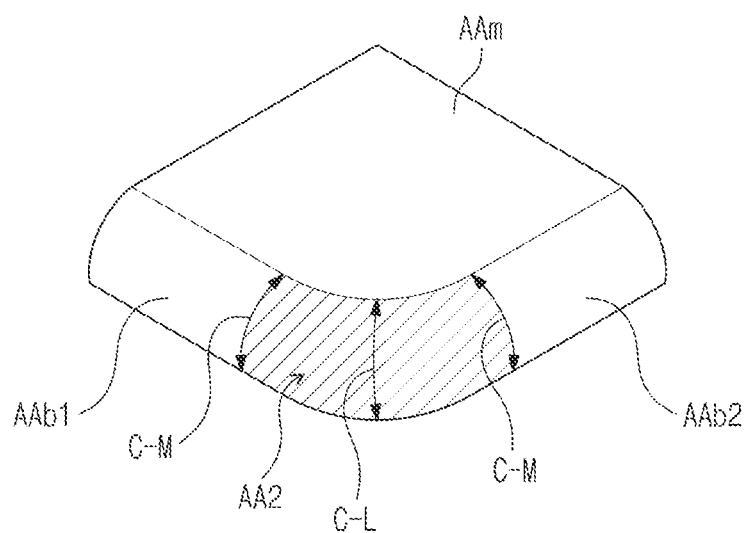
FIG. 1D is a perspective view of a corner region of a display device shown in FIG. 1A.
Figure 1D:
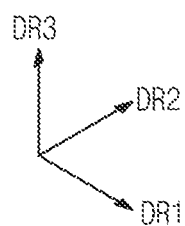

FIG. 1A is a perspective view of a display device DD according to an embodiment of the present disclosure. FIG. 1B is a side view of a display device DD shown in FIG. 1A as viewed in a first direction DR1. FIG. 1C is a side view of a display device DD shown in FIG. 1A as viewed in a second direction DR2. FIG. 1D is a perspective view of a corner region of a display device DD shown in FIG. 1A.

FIGS. 1A to 1D show that a display device DD is a smartphone as an example. However, the present disclosure may not be limited thereto, and the display device DD may be a large electronic device such as a television, a monitor, or the like, or a small or medium-sized electronic device such as a tablet, a vehicle navigation, a game console, a smart watch, or the like.

Three-dimensional active regions AA1 and AA2 in which an image is displayed may be defined in the display device DD. The three-dimensional active regions AA1 and AA2 may include the first active region AA1 and the second active region AA2. The first active region AA1 and the second active region AA2 are merely geometrically separated regions, and are substantially able to implement one display surface.

The first active region AA1 may include a front surface active region AAm, a first side surface active region AAb1, a second side surface active region AAb2, a third side surface active region AAb3, and a fourth side surface active region AAb4.

The front surface active region AAm is parallel to a plane defined by a first direction DR1 and a second direction DR2 crossing each other. A normal direction of the front surface active region AAm, that is, a thickness direction of the display device DD may be parallel to a third direction DR3. A front surface (or a top surface) and a rear surface (or a bottom surface) of each member of the display device DD may be distinguished by the third direction DR3.

The first side surface active region AAb1, the second side surface active region AAb2, the third side surface active region AAb3, and the fourth side surface active region AAb4 may extend from the front surface active region AAm while being extended bent from a first side, a second side, a third side, and a fourth side of the front surface active region AAm, respectively. That is, the first side surface active region AAb1, the second side surface active region AAb2, the third side surface active region AAb3, and the fourth side surface active region AAb4 may be regions curved from sides of the front surface active region AAm with respective curvatures. The first to fourth side surface active regions AAb1 to AAb4 may be curved to have a first curvature to a fourth curvature in (or along) the third direction DR3, respectively. Each of the first to fourth side surface active regions AAb1 to AAb4 may have a single curvature. All of the curvatures or radii of curvature of the first to fourth side surface active regions AAb1 to AAb4 may be the same as each other, or some may be the same and the others may be different from each other.

The second active region AA2 may be provided in plural including a plurality of second active regions AA2. In an embodiment, for example, the plurality of second active regions AA2 may be respectively defined between the first side surface active region AAb1 and the second side surface active region AAb2, between the second side surface active region AAb2 and the third side surface active region AAb3, between the third side surface active region AAb3 and the fourth side surface active region AAb4, and between the first side surface active region AAb1 and the fourth side surface active region AAb4, in a direction along an outer edge of the display device DD. The second active region AA2 may be referred to as a corner active region. Each of the second active regions AA2 may be curved to have a predetermined curvature in the third direction DR3. Each of the second active regions AA2 may have multiple curvatures (such as double curvatures).

Referring to the second active region AA2 shown in FIG. 1D, the second active region AA2 is adjacent to (or meets) each of the front surface active region AAm, the first side surface active region AAb1, and the second side surface active region AAb2. The second active region AA2 may have a maximum curvature C-M in regions respectively closest to the first side surface active region AAb1 and the second side surface active region AAb2 (or boundaries between the two regions), and may have a minimum curvature C-L in a region furthest from the first side surface active region AAb1 and the second side surface active region AAb2. The maximum curvature C-M may be the same as the first curvature of the first side surface active region AAb1 and a second curvature of the second side surface active region AAb2. The curvature is inversely proportional to the radius of curvature.

In one embodiment of the present disclosure, the first active region AA1 and the second active regions AA2 may both display an image. However, the present disclosure is not particularly limited thereto. In an embodiment, for example, at least one of the first side surface active region AAb1, the second side surface active region AAb2, the third side surface active region AAb3, and the fourth side surface active region AAb4 of the first active region AA1, and the second active regions AA2, may be a bezel region that does not display the image (e.g., non-display area).

Figure 2A:
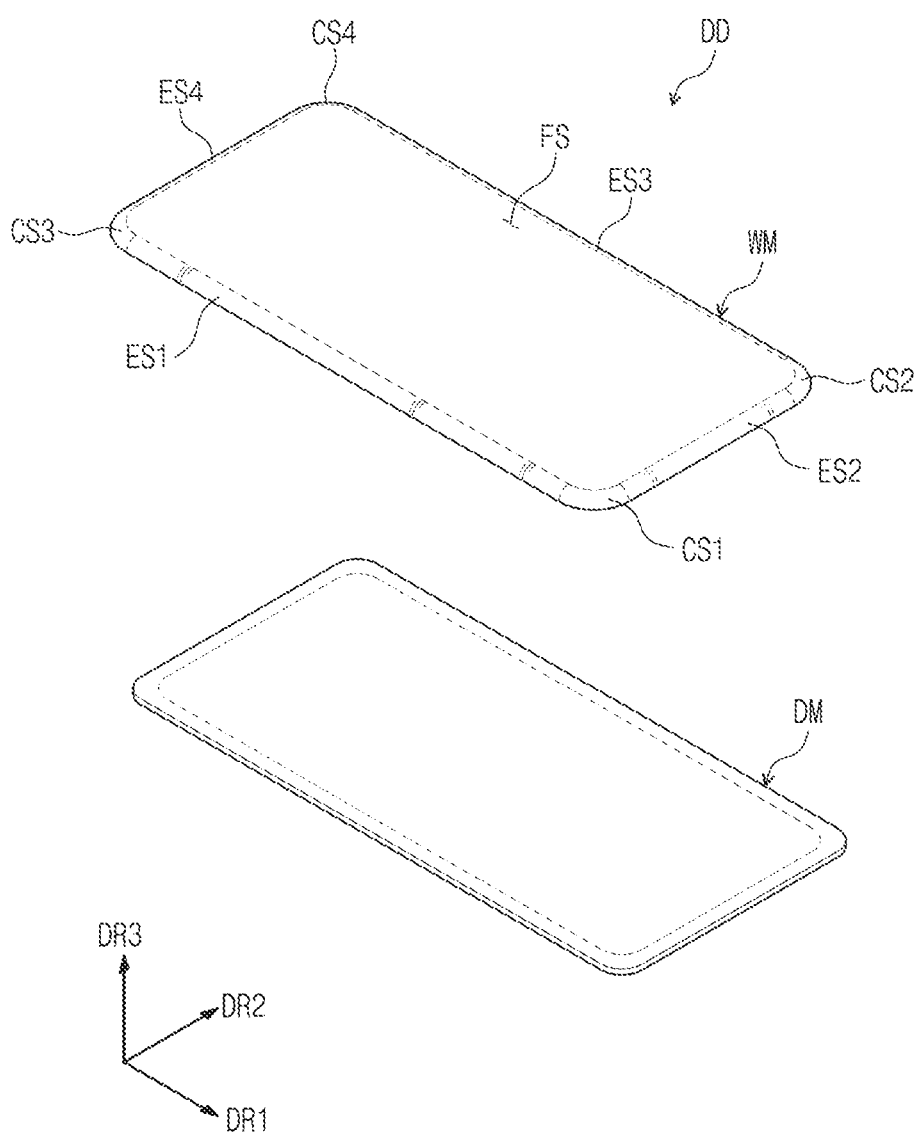
FIG. 2A is an exploded perspective view of a display device according to an embodiment of the present disclosure.
Figure 2B:
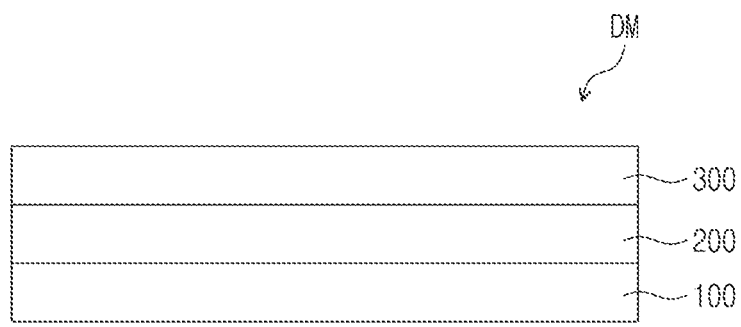
FIG. 2B is a cross-sectional view of a display module according to an embodiment of the present disclosure.
Figure 2C:
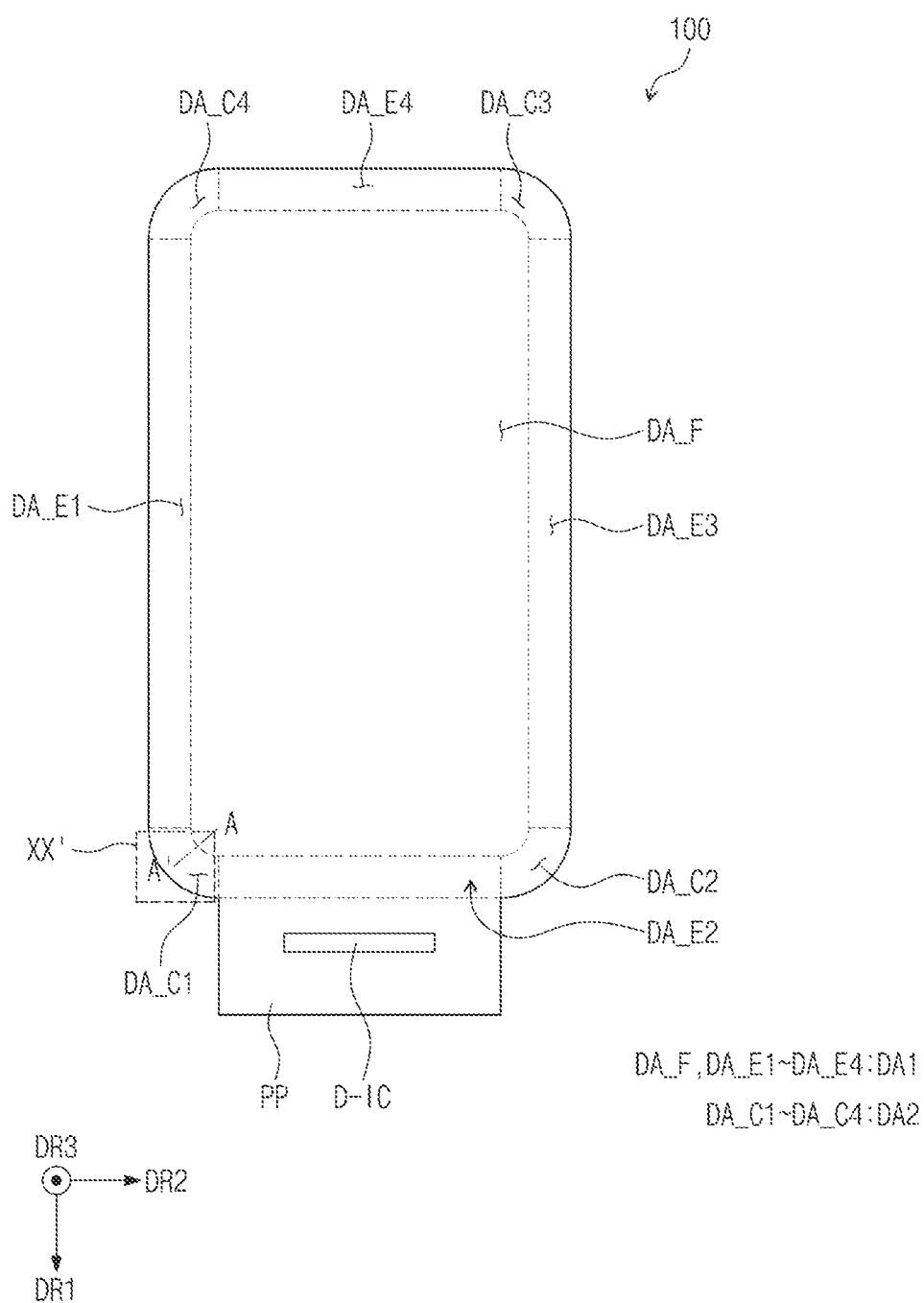
FIG. 2C is a plan view of a display panel according to an embodiment of the present disclosure.
Figure 2D:
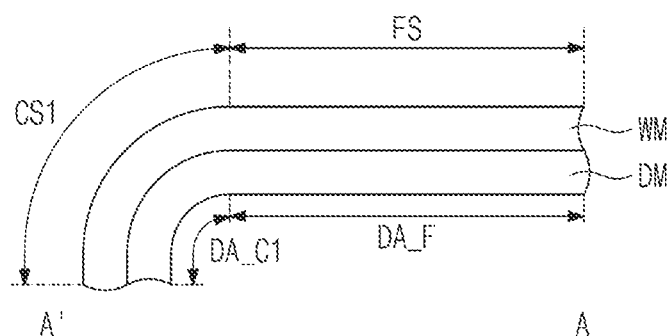
FIG. 2D is a cross-sectional view of a display device according to an embodiment of the present disclosure.

FIG. 2A is an exploded perspective view of a display device DD according to an embodiment of the present disclosure. FIG. 2B is a cross-sectional view of a display module DM according to an embodiment of the present disclosure. FIG. 2C is a plan view of a display panel 100 according to an embodiment of the present disclosure. FIG. 2D is a cross-sectional view of a display device DD according to an embodiment of the present disclosure.

Referring to FIGS. 2A to 2D, the display device DD (see FIG. 1A) may include a window WM and a display module DM. Although not shown separately, the display device DD may further include a support member that supports the display module DM. The support member may contain a material having a relatively high stiffness. In an embodiment, for example, the support member may include a plurality of frames and/or plates containing glass, plastic, or a metal, or a combination thereof.

The window WM is placed on the display module DM. The window WM may be optically transparent. Accordingly, the image displayed at a display panel 100 may be viewed from outside the display device DD, such as by a user, through the window WM. That is, the display surface of the display device DD may be defined by the window WM.

The window WM substantially provides an outer surface of the display device DD. The window WM may provide the first active region AA1 and the second active region AA2 described with reference to FIGS. 1A to 1D.

A base member of the window WM may include a front surface region FS, side surface regions ES1 to ES4 bent from respective sides of the front surface region FS, and corner regions CS1 to CS4 adjacent to the side surface regions ES1 to ES4. The front surface region FS may correspond to the front surface active region AAm (see FIG. 1A), the side surface regions ES1 to ES4 may respectively correspond to the first to fourth side surface active regions AAb1 to AAb4 (see FIG. 1A), and the corner regions CS1 to CS4 may respectively correspond to the second active regions AA2 (see FIG. 1A). In this specification, "a region corresponds to another region" means that the regions overlap and the regions are not limited to the same area (e.g., planar area, size, etc.).

As an example of the present disclosure, the window WM may include the four side surface regions ES1 to ES4, that is, the first side surface region ES1, the second side surface region ES2, the third side surface region ES3, and the fourth side surface region ES4 respectively extended bent from four sides of the front surface region FS. In this embodiment, the front surface region FS may be in or parallel to a plane defined by the first direction DR1 and the second direction DR2. Each of the first to fourth side surface regions ES1 to ES4 may have the same curvature as a corresponding region of the first to fourth side surface active regions AAb1 to AAb4 (see FIG. 1A).

As an example of the present disclosure, the first to fourth side surface regions ES1 to ES4 may have the same radius of curvature as each other. As an example, the first and third side surface regions ES1 and ES3 may have the same radius of curvature, the second and fourth side surface regions ES2 and ES4 may have the same radius of curvature, but the first and third side surface regions ES1 and ES3 may have a radius of curvature different from that of the second and fourth side surface regions ES3 and ES4.

Each of the first to fourth corner regions CS1 to CS4 may have at least two curvatures. Each of the first to fourth corner regions CS1 to CS4 may have a shape in which curved surfaces having different curvatures are continuously connected to each other.

As shown in FIG. 2B, the display module DM may include the display panel 100, a sensor layer 200, and an anti-reflection layer 300. At least some components of the display panel 100, the sensor layer 200, and the anti-reflection layer 300 may be formed (or provided) by a continuous process to be coupled to each other, or may be coupled to each other through an adhesive member. FIG. 2B shows the display module DM continuously formed without an adhesive layer, such as to form an interface between the various layers. Alternatively, the adhesive member may be selectively disposed between the display panel 100, the sensor layer 200, and the anti-reflection layer 300 to couple these elements to each other.

The display panel 100 may be a component that substantially generates the image. The display panel 100 may be a light emitting display panel. In an embodiment, for example, the display panel 100 may be an organic light emitting display panel, an inorganic light emitting display panel, an organic-inorganic light emitting display panel, a quantum dot display panel, a micro light emitting diode (LED) display panel, or a nano LED display panel. The display panel 100 may be referred to as a display layer. Hereinafter, the display panel 100 will be described as the organic light emitting display panel.

The sensor layer 200 may be disposed on the display panel 100. The sensor layer 200 may detect an external input applied from outside thereof and/or outside of the display module DM. The external input may include various types of external inputs, such as contact, relative proximity, light, heat, a pressure, or the like from an input tool such as a body part, a pen, etc.

The sensor layer 200 may be formed on the display panel 100 through the continuous process. In this case, it may be expressed that the sensor layer 200 is directly disposed on the display panel 100. "Directly disposed" may mean that a third component is not disposed between the sensor layer 200 and the display panel 100. That is, the separate adhesive member may not be disposed between the sensor layer 200 and the display panel 100. Alternatively, the sensor layer 200 may be coupled to the display panel 100 through the adhesive member. The adhesive member may include a conventional adhesive or gluing agent.

The anti-reflection layer 300 may be disposed on the sensor layer 200. The anti-reflection layer 300 may reduce a reflectance of external light incident from the outside of the display module DM. The anti-reflection layer 300 may be formed on the sensor layer 200 through the continuous process. The anti-reflection layer 300 may include color filters 320. The color filters 320 may have an arrangement. In an embodiment, for example, the color filters 320 may be arranged in consideration of light emission colors of pixels included in the display panel 100. In addition, the anti-reflection layer 300 may further include a black matrix adjacent to the color filters 320. A detailed description of the anti-reflection layer 300 will be achieved later.

Referring to FIG. 2C, the display panel 100 may include display regions DA1 and DA2 in which a display element such as the pixels are disposed. As an example of the present disclosure, the display regions DA1 and DA2 may include the first display region DA1 (hereinafter, a first region DA1) and the second display region DA2 (hereinafter, a second region). Although not shown separately, a non-display region defined along an edge may be defined in the display panel 100.

The first region DA1 may include a front surface display region DA_F and first to fourth side surface display regions DA_E1 to DA_E4. The front surface display region DA_F is a region corresponding to the front surface region FS, such as when the display module DM is attached to the window WM. The first to fourth side surface display regions DA_E1 to DA_E4 are regions respectively corresponding to the first to fourth side surface regions ES1 to ES4, such as when the display module DM is attached to the window WM. The second region DA2 may include a corner display region including first to fourth corner display regions DA_C1 to DA_C4. The first to fourth corner display regions DA_C1 to DA_C4 are regions respectively corresponding to the first to fourth corner regions CS1 to CS4, such as when the display module DM is attached to the window WM.

The display panel 100 may further include a third region PP extending from the second side surface display region DA_E2. A driving chip D-IC and pads may be disposed in the third region PP. The driving chip D-IC may provide electrical signals such as driving signals to the first and second regions DA1 and DA2 of the display panel 100. The driving chip D-IC may be mounted on the display panel 100. The display panel 100 may be electrically connected to a printed circuit board outside of the display panel 100 (not shown) through the pads. In one embodiment of the present disclosure, the driving chip D-IC may be mounted on the printed circuit board. The third region PP may be bent so as to be disposed facing a rear surface of the front surface display region DA_F.

FIG. 2D corresponds to a cross-section of the second active region AA2 shown in FIG. 1D. FIG. 2D corresponds to a cross-section along line A-A' of FIG. 2C. FIG. 2D shows the front surface display region DA_F coupled to the front surface region FS, and the first corner display region DA_C1 coupled to the first corner region CS1. In FIG. 2D, the display module DM is shown attached to the window WM, and region indication is based on the display panel 100.

Figure 3A:
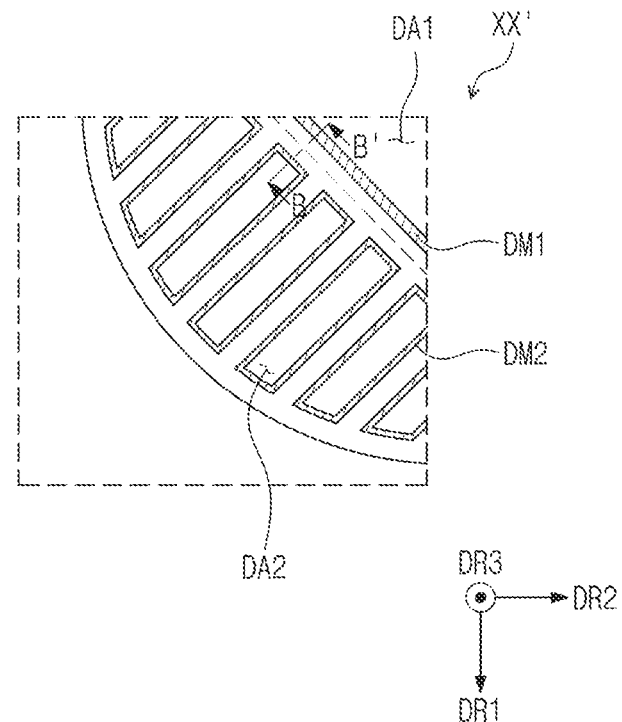
FIG. 3A is a plan view showing an enlarged XX' region of FIG. 2C.
Figure 3B:
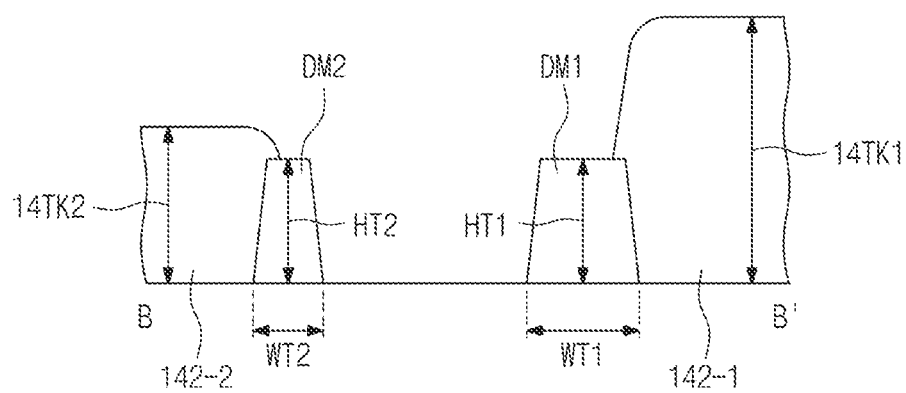
FIG. 3B is a cross-sectional view of a display panel according to an embodiment of the present disclosure.

FIG. 3A is a plan view showing an enlarged region XX' of FIG. 2C. FIG. 3B is a cross-sectional view of a display panel 100 according to an embodiment of the present disclosure.

Referring to FIGS. 2C and 3A, the display panel 100 may include a first dam DM1 disposed in the first region DA1, and a second dam DM2 provided in plural including a plurality of second dams DM2 disposed in the second region DA2. In an embodiment, for example, the first dam DM1 may have a shape surrounding the front surface display region DAF and the first to fourth side surface display regions DA_E1 to DA_E4. Each of the front surface display region DA_F and the first to fourth side surface display regions DA_E1 to DA_E4 may have a planar shape defined by an outer edge thereof, and the first dam DM1 may respectively extend along the outer edge. A plurality of the second dams DM2 may be provided to each of the first to fourth corner display regions DA_C1 to DA_C4. That is, the second dams DM2 may be disposed in one corner display region, for example, the first corner display region DA_C1. Each region defined by the second dams DM2 may be referred to as a stripe region within the one corner display region.

Referring to FIG. 3B, a portion corresponding to line B-B' in FIG. 3A is shown. Referring to FIG. 3B, the first dam DM1, the second dam DM2, a first organic encapsulation layer 142-1, and a second organic encapsulation layer 142-2 are illustrated. Each of the first dam DM1 and the second dam DM2 may control or restrict a flow of a monomer when providing the monomer, and may prevent (or reduce) each of the first organic encapsulation layer 142-1 and the second organic encapsulation layer 142-2 formed from the monomer from being exposed to the outside.

A first dam height HT1 of the first dam DM1 and a second dam height HT2 of the second dam DM2 may be equal to each other. In an embodiment, for example, each of the first dam DM1 and the second dam DM2 may include a plurality of layers which are stacked. The first dam DM1 and the second dam DM2 may include layers of the same composition. However, the first dam height HT1 of the first dam DM1 and the second dam height HT2 of the second dam DM2 may be different from each other.

A first width WT1 of the first dam DM1 and a second width WT2 of the second dam DM2 may be different from each other. In an embodiment, for example, the first width WT1 of the first dam DM1 closer to the first region DA1 than the second dam DM2, may be greater than the second width WT2 of the second dam DM2. The respective widths may be a maximum width of a respective dam among the first dam DM1 and the second dam DM2, without being limited thereto.

A first thickness 14TK1 of the first organic encapsulation layer 142-1 may be greater than a second thickness 14TK2 of the second organic encapsulation layer 142-2. An area of a region may be a total planar area, without being limited thereto. An area of a region where the monomer for forming the second organic encapsulation layer 142-2 is provided is smaller than an area of a region where the monomer for forming the first organic encapsulation layer 142-1 is provided. Accordingly, in consideration of a process margin, the second thickness 14TK2 of the second organic encapsulation layer 142-2 may be designed to be smaller than the first thickness 14TK1 of the first organic encapsulation layer 142-1.

Figure 4:
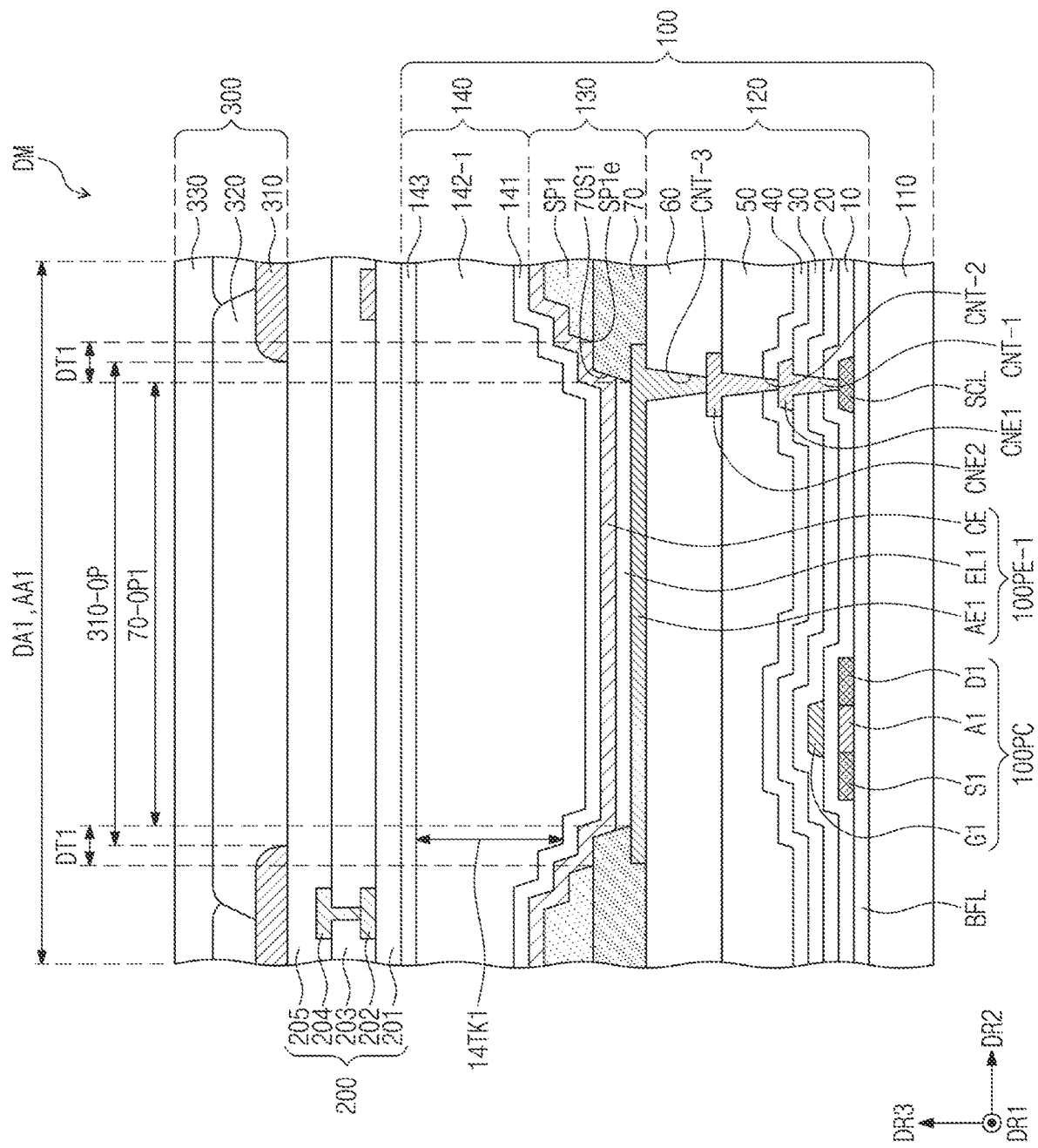
FIG. 4 is a cross-sectional view of a display module according to an embodiment of the present disclosure.
Figure 5A:
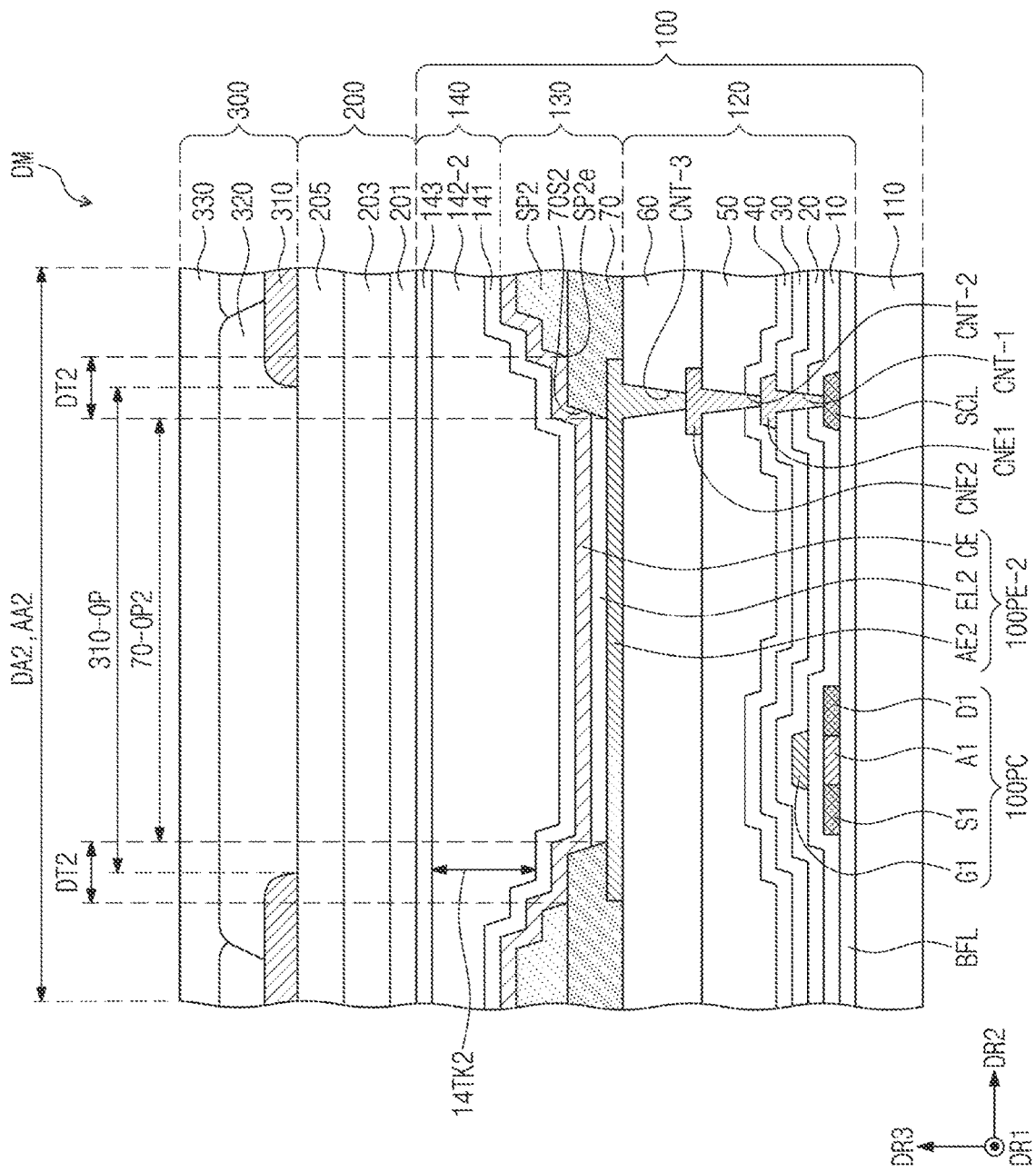
FIG. 5A is a cross-sectional view of a display module according to an embodiment of the present disclosure.

FIG. 4 is a cross-sectional view of a display module DM according to an embodiment of the present disclosure. FIG. 5A is a cross-sectional view of a display module DM according to an embodiment of the present disclosure. FIG. 4 is a cross-sectional view of a display module DM including the first region DA1, and FIG. 5A is a cross-sectional view of a display module DM including the second region DA2.

Referring to FIGS. 4 and 5A, the display panel 100 may include a base layer 110, a circuit layer 120, a light emitting element layer 130, and an encapsulation layer 140.

The base layer 110 may be a member that provides a base surface on which the circuit layer 120 is disposed. The base layer 110 may be a flexible substrate which is bendable, foldable, rollable and the like and is capable of being bent, folded, rolled, and the like. The base layer 110 may be a glass substrate, a metal substrate, a polymer substrate, or the like. However, the embodiment may not be limited thereto, and the base layer 110 may be an inorganic layer, an organic layer, or a composite material layer.

The circuit layer 120 may be disposed on the base layer 110. The circuit layer 120 may include an insulating layer, a semiconductor pattern, a conductive pattern, a signal line, and the like. The insulating layer, a semiconductor layer, and a conductive layer may be formed on the base layer 110 by coating, deposition, and the like, and then, the insulating layer, the semiconductor layer, and the conductive layer may be selectively patterned through a plurality of photolithography processes. Thereafter, the semiconductor pattern, the conductive pattern, and the signal line included in the circuit layer 120 may be formed.

A buffer layer BFL may be disposed on the base layer 110. The buffer layer BFL may prevent diffusion of metal atoms or impurities from the base layer 110 into the semiconductor pattern. In addition, the buffer layer BFL may adjust a supply speed of heat during a crystallization process for forming the semiconductor pattern to allow the semiconductor pattern to be uniformly formed.

The semiconductor pattern may be disposed on the buffer layer BFL. The semiconductor pattern may include a silicon semiconductor. In an embodiment, for example, the silicon semiconductor may include amorphous silicon, polycrystalline silicon, or the like. In an embodiment, for example, the semiconductor pattern may include low-temperature polysilicon. However, the present disclosure is not limited thereto. The semiconductor pattern may include an oxide semiconductor.

FIGS. 4 and 5A only show a portion of the semiconductor pattern disposed on the buffer layer BFL, and the semiconductor pattern may be further disposed in another region. The semiconductor pattern may be arranged across the pixels. The semiconductor pattern may have different electrical properties depending on a doping level of various regions. The semiconductor pattern may include a first semiconductor region having high conductivity and a second semiconductor region having low conductivity. The first semiconductor region may be doped with an N-type dopant or a P-type dopant. A P-type transistor may include a doped region doped with the P-type dopant, and an N-type transistor may include a doped region doped with the N-type dopant. The second semiconductor region may be a non-doped region or a region doped at a lower concentration compared to the first semiconductor region.

The conductivity of the first semiconductor region may be greater than that of the second semiconductor region, and the first semiconductor region may substantially serve as an electrode or a signal line. The second semiconductor region may substantially correspond to an active region (or a channel) of the transistor 100PC. In other words, a portion of the semiconductor pattern may be the active region of the transistor 100PC, another portion thereof may be a source or a drain of the transistor 100PC, and a remaining portion thereof may be a connection electrode or a connection signal line SCL.

Each of the pixels may have an equivalent circuit including seven transistors, one capacitor, and a light emitting element, and an equivalent circuit diagram of the pixel may be modified in various forms. In each of FIGS. 4 and 5A, a transistor 100PC included in the pixel is illustrated. FIG. 4 illustrates a first light emitting element 100PE-1 disposed in the first region DA1, and FIG. 5A illustrates a second light emitting element 100PE-2 disposed in the second region DA2.

A source region S1, an active region A1, and a drain region D1 of the transistor 100PC may be formed from the semiconductor pattern. The source region S1 and the drain region D1 may extend in opposite directions from the active region A1 on a cross-section. A portion of a connection signal line SCL formed from the semiconductor pattern is illustrated in each of FIGS. 4 and 5A. Although not shown separately, the connection signal line SCL may be connected to the drain region D1 of the transistor 100PC on a plane.

A first insulating layer 10 may be disposed on the buffer layer BFL. The first insulating layer 10 may overlap a plurality of pixels in common and cover the semiconductor pattern. The first insulating layer 10 may be the inorganic layer and/or the organic layer, and may have a single-layer or multi-layer structure. The first insulating layer 10 may contain at least one of aluminum oxide, titanium oxide, silicon oxide, silicon nitride, silicon oxynitride, zirconium oxide, and hafnium oxide. In this embodiment, the first insulating layer 10 may be a single-layer silicon oxide layer. An insulating layer of the circuit layer 120 to be described later as well as the first insulating layer 10 may be the inorganic layer and/or the organic layer, and may have the single-layer or multi-layer structure. The inorganic layer may contain at least one of the above-described materials, but may not be limited thereto.

A gate G1 of the transistor 100PC is disposed on the first insulating layer 10. The gate G1 may be a portion of a metal pattern. The gate G1 overlaps the active region A1. In the process of doping the semiconductor pattern, the gate G1 may function as a mask.

A second insulating layer 20 may be disposed on the first insulating layer 10 and may cover the gate G1. The second insulating layer 20 may overlap pixels in common. The second insulating layer 20 may be the inorganic layer and/or the organic layer, and may have the single-layer or multi-layer structure. In this embodiment, the second insulating layer 20 may be a single-layer silicon oxide layer or silicon nitride layer.

A third insulating layer 30 may be disposed on the second insulating layer 20. In this embodiment, the third insulating layer 30 may be the single-layer silicon oxide layer or silicon nitride layer.

A first connection electrode CNE1 may be disposed on the third insulating layer 30. The first connection electrode CNE1 may be connected to the connection signal line SCL through a first contact hole CNT-1 penetrating the first, second, and third insulating layers 10, 20, and 30.

A fourth insulating layer 40 may be disposed on the third insulating layer 30. The fourth insulating layer 40 may be the single-layer silicon oxide layer. A fifth insulating layer 50 may be disposed on the fourth insulating layer 40. The fifth insulating layer 50 may be the organic layer.

A second connection electrode CNE2 may be disposed on the fifth insulating layer 50. The second connection electrode CNE2 may be connected to the first connection electrode CNE1 through a second contact hole CNT-2 penetrating the fourth insulating layer 40 and the fifth insulating layer 50.

A sixth insulating layer 60 may be disposed on the fifth insulating layer 50 and may cover the second connection electrode CNE2. The sixth insulating layer 60 may be the organic layer.

The light emitting element layer 130 may be disposed on the circuit layer 120. The light emitting element layer 130 may include the first light emitting element 100PE-1 disposed in the first region DA1, the second light emitting element 100PE-2 disposed in the second region DA2, a pixel defining film 70 (e.g., pixel defining layer), a first spacer SP1 disposed in the first region DA1, and a second spacer SP2 disposed in the second region DA2. In an embodiment, for example, each of the first light emitting element 100PE-1 and the second light emitting element 100PE-2 may include an organic light emitting material, an inorganic light emitting material, an organic-inorganic light emitting material, a quantum dot, a quantum rod, a micro LED, or a nano LED.

The first light emitting element 100PE-1 may include a first pixel electrode AE1, a first light emitting layer ELL and a common electrode CE. The second light emitting element 100PE-2 may include a second pixel electrode AE2, a second light emitting layer EL2, and the common electrode CE.

Each of the first pixel electrode AE1 and the second pixel electrode AE2 may be disposed on the sixth insulating layer 60. The first pixel electrode AE1 may be connected to the second connection electrode CNE2 through a third contact hole CNT-3 penetrating the sixth insulating layer 60.

The pixel defining film 70 may be disposed on the sixth insulating layer 60. The pixel defining film 70 may have a black color. The pixel defining film 70 may contain a black coloring agent. The black coloring agent may include a black dye and a black pigment. The black coloring agent may contain carbon black, a metal such as chromium, or an oxide thereof.

The pixel defining film 70 may cover a portion of each of the first pixel electrode AE1 and the second pixel electrode AE2. A first opening 70-OP1 and a second opening 70-OP2 may be defined in the pixel defining film 70. The first opening 70-OP1 of the pixel defining film 70 may overlap a portion of the first pixel electrode AE1 and may not overlap the remaining portion thereof (e.g., is adjacent to the first pixel electrode AE1). That is, the first opening 70-OP1 exposes at least a portion of the first pixel electrode AE1 to outside the pixel defining film 70. The second opening 70-OP2 of the pixel defining film 70 may overlap a portion of the second pixel electrode AE2 and may not overlap the remaining portion thereof. That is, the second opening 70-OP2 exposes at least a portion of the second pixel electrode AE2 to outside the pixel defining film 70.

The first spacer SP1 may be disposed in the first region DA1, and may be disposed on the pixel defining film 70. The second spacer SP2 may be disposed in the second region DA2, and may be disposed on the pixel defining film 70. Each of the first spacer SP1 and the second spacer SP2 may be disposed spaced apart from each of the first opening 70-OP1 and the second opening 70-OP2. The first spacer SP1 and the second spacer SP2 may together define a spacer layer.

Each of the first spacer SP1 and the second spacer SP2 may be provided to prevent engraving by a mask for deposition, for example, a fine metal mask used when forming each of the first light emitting layer EL1 and the second light emitting layer EL2.

A first distance DT1 between a first sidewall 70S1 of the pixel defining film 70 defining the first opening 70-OP1 and a first edge SP1e of the first spacer SP1 may be smaller than a second distance DT2 between a second sidewall 70S2 of the pixel defining film 70 defining the second opening 70-OP2 and a second edge SP2e of the second spacer SP2.

The pixel defining film 70 may include a first pixel defining portion 70-1 disposed in the first region DA1 and a second pixel defining portion 70-2 disposed in the second region DA2. The various pixel defining portions may correspond to solid or material portions of the pixel defining film 70. Each of the defining portions of the pixel defining film 70, and the spacers, may define an area along the base layer 110. The area may be a planar area along a plane defined by the first direction DR1 and the second direction DR2 crossing each other. A ratio of an area of the first pixel defining portion 70-1 covered by (or corresponding to) the first spacer SP1 to a total area of the first pixel defining portion 70-1, may be higher than a ratio of an area of the second pixel defining portion 70-2 covered by (or corresponding to) the second spacer SP2 to a total area of the second pixel defining portion 70-2. In an embodiment, for example, a portion of the first pixel defining portion 70-1 and a portion of the second pixel defining portion 70-2 overlaps the first spacer SP1 and the second spacer SP2, to define a first spacer area and a second spacer area, respectively, such that a ratio of the first spacer area to the total area of the first pixel defining portion 70-1 is greater than a ratio of the second spacer area to the total area of the second pixel defining portion 70-2. In this case, durability of the display device DD (see FIG. 1A) may be improved by the first spacer SP1 covering a relatively large area, and stain defects of the display device DD (see FIG. 1A) may be reduced by the second spacer SP2 covering a relatively small area. A detailed description of the first and second spacers SP1 and SP2 will be achieved later.

The first light emitting layer EL1 may be disposed on the first pixel electrode AE1, and the second light emitting layer EL2 may be disposed on the second pixel electrode AE2. The first light emitting layer EL1 may be disposed in a region corresponding to the first opening 70-OP1, and the second light emitting layer EL2 may be disposed in a region corresponding to the second opening 70-OP2.

The encapsulation layer 140 may be disposed on the light emitting element layer 130. The encapsulation layer 140 may include a first inorganic encapsulation layer 141, first and second organic encapsulation layers 142-1 and 142-2, and a second inorganic encapsulation layer 143 that are sequentially stacked, but layers constituting the encapsulation layer 140 may not be limited thereto.

The first and second inorganic encapsulation layers 141 and 143 may protect the light emitting element layer 130 from moisture and oxygen, and the first and second organic encapsulation layers 142-1 and 142-2 may protect the light emitting element layer 130 from foreign substances such as dust particles. The first and second inorganic encapsulation layers 141 and 143 may include a silver silicon nitride layer, a silicon oxynitride layer, a silicon oxide layer, a titanium oxide layer, an aluminum oxide layer, or the like. The first and second organic encapsulation layers 142-1 and 142-2 may include an acryl-based organic layer, but the present disclosure may not be limited thereto.

The first organic encapsulation layer 142-1 may be disposed between the first inorganic encapsulation layer 141 and the second inorganic encapsulation layer 143, and may be disposed in the first region DA1. The second organic encapsulation layer 142-2 may be disposed between the first inorganic encapsulation layer 141 and the second inorganic encapsulation layer 143, and may be disposed in the second region DA2. The first thickness 14TK1 of the first organic encapsulation layer 142-1 may be greater than the second thickness 14TK2 of the second organic encapsulation layer 142-2. Each of the first thickness 14TK1 and the second thickness 14TK2 may be a thickness of a region overlapping a flat top surface of the pixel defining film 70. The flat top surface may be an upper surface which is furthest from the base layer 110, without being limited thereto. In an embodiment, for example, the first thickness 14TK1 may be twice the second thickness 14TK2, so that the first thickness 14TK1 may be about 8 micrometers (μm) and the second thickness 14TK2 may be about 4 μm. However, this is only an example and the present disclosure is not limited to the above-described values.

The sensor layer 200 may include a base layer 201, a first conductive layer 202, a sensing insulating layer 203, a second conductive layer 204, and a cover insulating layer 205.

The base layer 201 may be directly disposed on the display panel 100. The base layer 201 may be an inorganic layer containing at least one of silicon nitride, silicon oxynitride, and silicon oxide. Alternatively, the base layer 201 may be an organic layer containing an epoxy resin, an acrylic resin, or an imide-based resin. The base layer 201 may have the single-layer structure or the multi-layer structure stacked along the third direction DR3.

Each of the first conductive layer 202 and the second conductive layer 204 may have the single-layer structure or the multi-layer structure stacked along the third direction DR3.

The single-layered conductive layer may include a metal layer or a transparent conductive layer. The metal layer may contain molybdenum, silver, titanium, copper, aluminum, or an alloy thereof. The transparent conductive layer may contain a transparent conductive oxide such as indium tin oxide (ITO), indium zinc oxide (IZO), zinc oxide (ZnO), indium zinc tin oxide (IZTO), or the like. In addition, the transparent conductive layer may include a conductive polymer such as PEDOT, a metal nanowire, graphene, and the like.

The multi-layer conductive layer may include metal layers. The metal layers may have, for example, a three-layer structure of titanium/aluminum/titanium. The multi-layer conductive layer may include at least one metal layer and at least one transparent conductive layer.

The sensor layer 200 may acquire information about the external input applied to the display device DD, through a change in mutual capacitance or acquire the information on the external input through a change in self-capacitance. In an embodiment, for example, the sensor layer 200 may include sensing patterns and bridge patterns. At least some of the sensing patterns and the bridge patterns may be included in the first conductive layer 202, and at least some of the sensing patterns and the bridging patterns may be included in the second conductive layer 204.

The sensing patterns and the bridge patterns may be disposed to overlap the first region DA1, and may not overlap the second region DA2. In this case, the display device DD shown in FIG. 1A may sense the external input through the front surface active region AAm, the first side surface active region AAb1, the second side surface active region AAb2, the third side surface active region AAb3 and the fourth side surface active region AAb4, and the second active region AA2 may display only the image and may not sense the external input.

The sensing insulating layer 203 and the cover insulating layer 205 may include an inorganic film. The inorganic layer may contain at least one of aluminum oxide, titanium oxide, silicon oxide, silicon nitride, silicon oxynitride, zirconium oxide, and hafnium oxide. Alternatively, the sensing insulating layer 203 and the cover insulating layer 205 may include an organic film. The organic film may contain at least one of the acrylic resin, a methacrylic resin, polyisoprene, a vinyl-based resin, the epoxy-based resin, a urethane-based resin, a cellulose-based resin, a siloxane-based resin, a polyimide-based resin, a polyamide-based resin, and a perylene-based resin. The sensing insulating layer 203 may be referred to as the organic layer. In one embodiment, the cover insulating layer 205 may be omitted.

The base layer 201, the sensing insulating layer 203, and the cover insulating layer 205 of the sensor layer 200 may be provided not only at the first region DA1, but also at the second region DA2 for sealing performance improvement. FIG. 4 together with FIG. 5A illustrate that all of the base layer 201, the sensing insulating layer 203, and the cover insulating layer 205 which are in the first region DA1 are extended to be disposed in the second region DA2 as an example, but the present disclosure is not particularly limited thereto. In an embodiment, for example, at least one of the base layer 201, the sensing insulating layer 203, and the cover insulating layer 205 may be disposed in the second region DA2.

The anti-reflection layer 300 may be disposed on the sensor layer 200. The anti-reflection layer 300 may include a partitioned layer 310, a color filter 320 provided in plural including a plurality of color filters 320, and a planarized layer 330.

A material constituting the partitioned layer 310 is not particularly limited as long as the material absorbs light. The partitioned layer 310 is a layer having the black color. In one embodiment, the partitioned layer 310 may contain the black coloring agent. The black coloring agent may include the black dye and the black pigment. The black coloring agent may contain the carbon black, the metal such as chromium, or the oxide thereof. The partitioned layer 310 may be referred to as the black matrix.

A plurality of partitioning openings 310-OP may be defined in the partitioned layer 310, such as by material portions spaced apart from each other. The plurality of partitioning openings 310-OP may correspond to the plurality of first openings 70-OP1 and the plurality of second openings 70-OP2, to define a light emission area provided in plural. The color filters 320 may be disposed in the plurality of partitioning openings 310-OP, respectively. The planarized layer 330 may cover the color filters 320. The planarized layer 330 may contain an organic material, and may provide a flat surface on a top surface of the planarized layer 330. In one embodiment, the planarized layer 330 may be omitted.

Figure 5B:
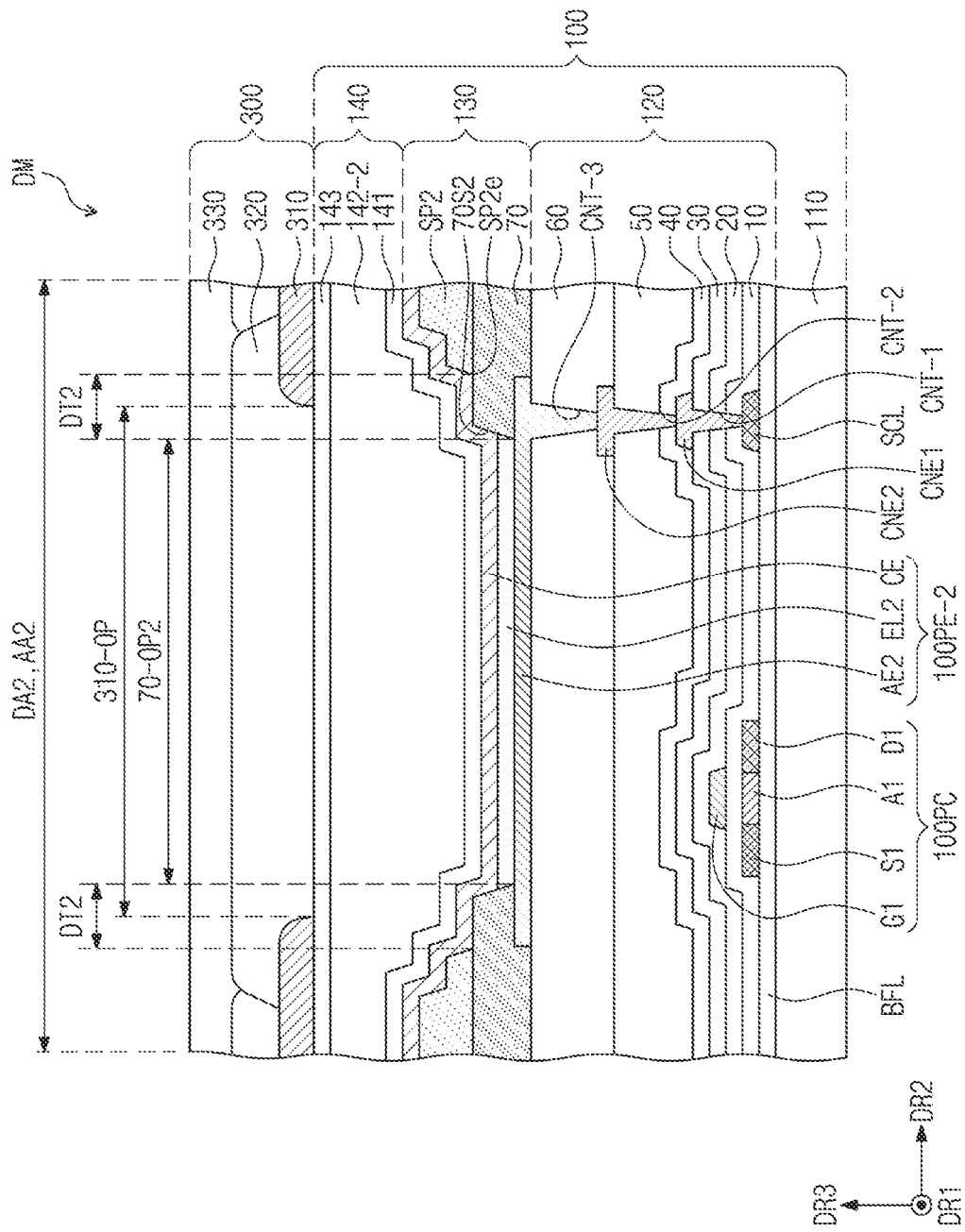
FIG. 5B is a cross-sectional view of a display module according to an embodiment of the present disclosure.

FIG. 5B is a cross-sectional view of a display module DM according to an embodiment of the present disclosure. FIG. 5B is a cross-sectional view of a display module DM including the second region DA2. In a description of FIG. 5B, only portions different from those of FIG. 5A will be described.

Referring to FIGS. 4 and 5B, the sensor layer 200 may overlap only the first region DA1 and may not overlap the second region DA2. In an embodiment, for example, all of the base layer 201, the first conductive layer 202, the sensing insulating layer 203, the second conductive layer 204 and the cover insulating layer 205 constituting the sensor layer 200 in the first region DA1 may not extend to the second region DA2 and therefore may not overlap the second region DA2.

The anti-reflection layer 300 may be directly disposed on the display panel 100 in the second region DA2. As the sensor layer 200 does not overlap the second region DA2, a thickness of the second region DA2 may become smaller, and a shape deformation of the second region DA2 having a double curvature may become easier.

Figure 6:
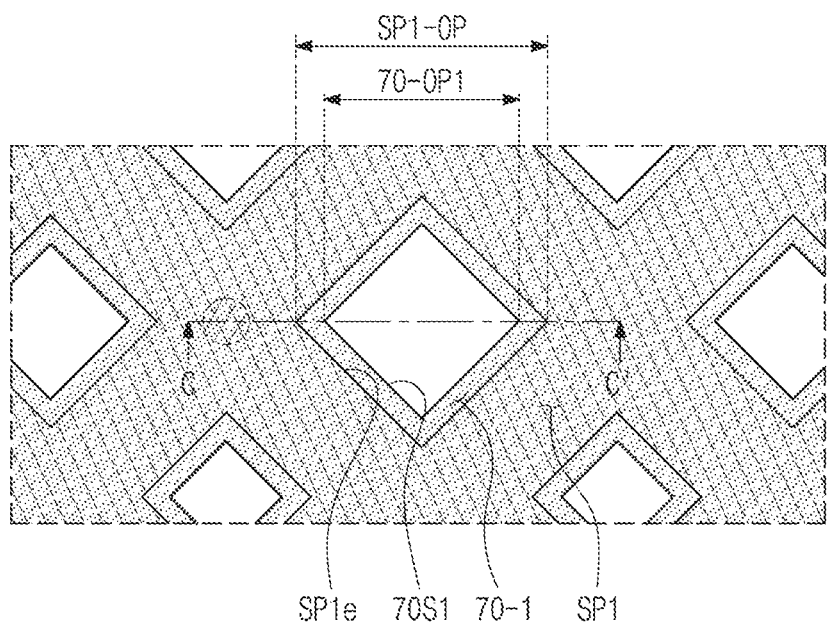
FIG. 6 is a plan view of a display panel according to an embodiment of the present disclosure.
Figure 6:
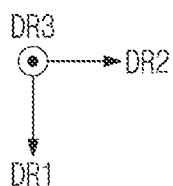
Figure 7:
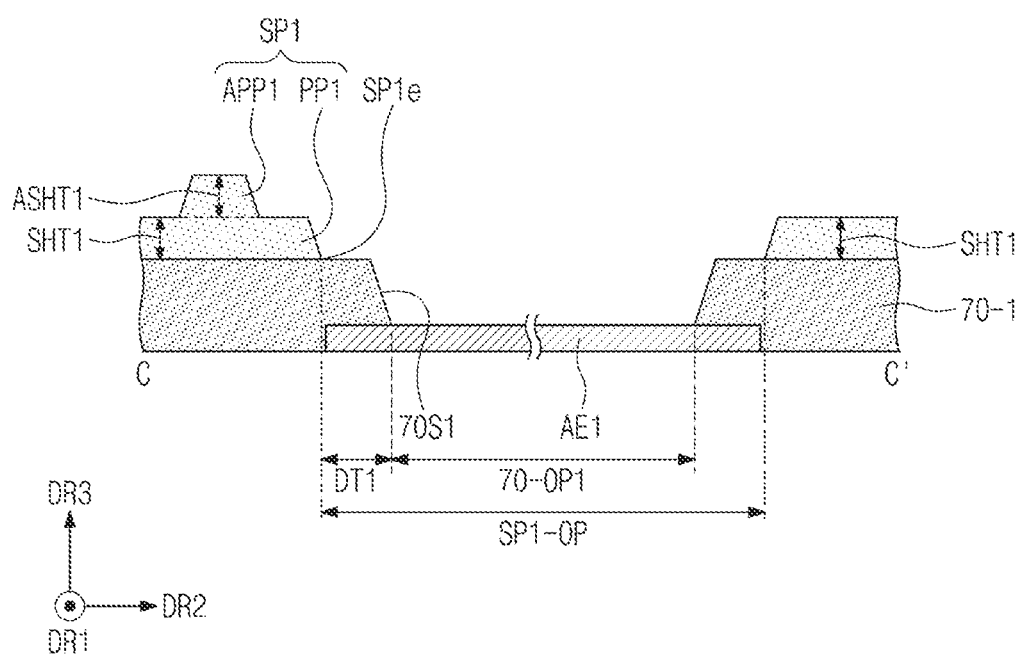
FIG. 7 is a cross-sectional view of a display panel according to an embodiment of the present disclosure.

FIG. 6 is a plan view of a display panel 100 according to an embodiment of the present disclosure. FIG. 7 is a cross-sectional view of a display panel 100 according to an embodiment of the present disclosure. FIG. 6 shows a first pixel defining portion 70-1 and the first spacer SP1 which are disposed in the first region DA1 (see FIG. 4). FIG. 7 is a cross-sectional view illustrating a cross-section taken along line C-C' of FIG. 6. FIG. 7 shows the first pixel electrode AE1, the first pixel defining portion 70-1, and the first spacer SP1.

Referring to FIGS. 6 and 7, the first spacer SP1 may include a first protruding portion PP1 (e.g., a first lower protruding portion) having a first height SHT1 and a first additional protruding portion APP1 (e.g., a first protrusion) which further protrudes from a top surface of the first protruding portion PP1. The first protruding portion PP1 and the first additional protruding portion APP1 may contain the same material as each other and may have an integral shape to form a single body. The first edge SP1e of the first spacer SP1 may be defined by an edge of the first protruding portion PP1.

The first protruding portion PP1 may have a shape (e.g., a planar shape) similar to that of the first pixel defining portion 70-1. In an embodiment, for example, a first spacer opening SP1-OP overlapping the first opening 70-OP1 may be defined in (or by) the first protruding portion PP1. The first spacer opening SP1-OP may be larger than the first opening 70-OP1.

The plurality of first additional protruding portions APP1 may be provided and may be arranged to be spaced apart from each other along the first protruding portion PP1. In an embodiment, for example, within the first spacer SP1, a first upper protruding portion (e.g., the first additional protruding portion APP1) may be provided in plural including a plurality of first upper protruding portions spaced apart from each other along the pixel defining layer. It is shown in FIG. 6 that the first additional protruding portion APP1 has a circular shape on a plane as an example (refer to dotted line circle in FIG. 6), but the present disclosure is not particularly limited thereto. In an embodiment, for example, the first additional protruding portion APP1 may have various planar shapes, such as a polygonal shape, an elliptical shape, and an irregular shape.

A ratio of an area of a portion of the first pixel defining portion 70-1 covered by the first spacer SP1 to a total area of the first pixel defining portion 70-1, may be equal to or greater than a predetermined value. In an embodiment, for example, the predetermined value may be about 50%. That is, 50% or more of a top surface of the first pixel defining portion 70-1 may be covered by the first spacer SP1 to define a covered area of the first pixel defining portion 70-1. As the covered area of the first pixel defining portion 70-1 increases, the durability of the display device DD (see FIG. 1A) may be improved.

When providing the external input to the display device DD (see FIG. 1A), such as by using a pen as an input tool, a tensile strain or a compressive strain may occur depending on a moving direction of the pen. According to the embodiment of the present disclosure, as the ratio of the first pixel defining portion 70-1 covered by the first spacer SP1 increases, a film lifting phenomenon or a film shape deformation caused by an external stress from an input tool may be reduced. As a result, the display device DD (see FIG. 1A) with the improved durability may be provided.

Figure 8:
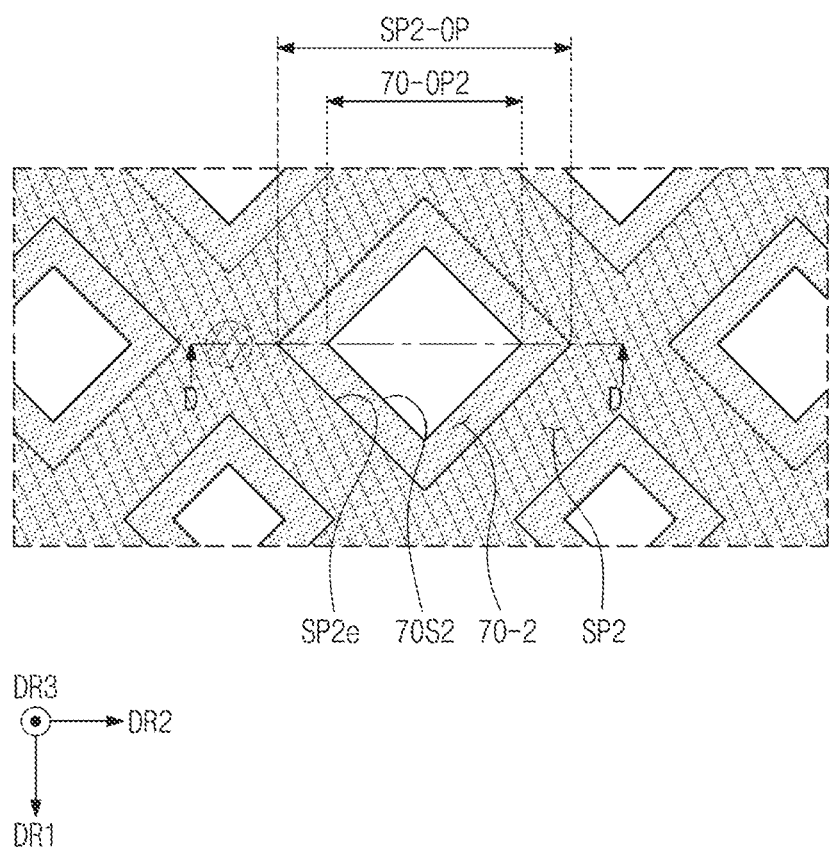
FIG. 8 is a plan view of a display panel according to an embodiment of the present disclosure.
Figure 9A:
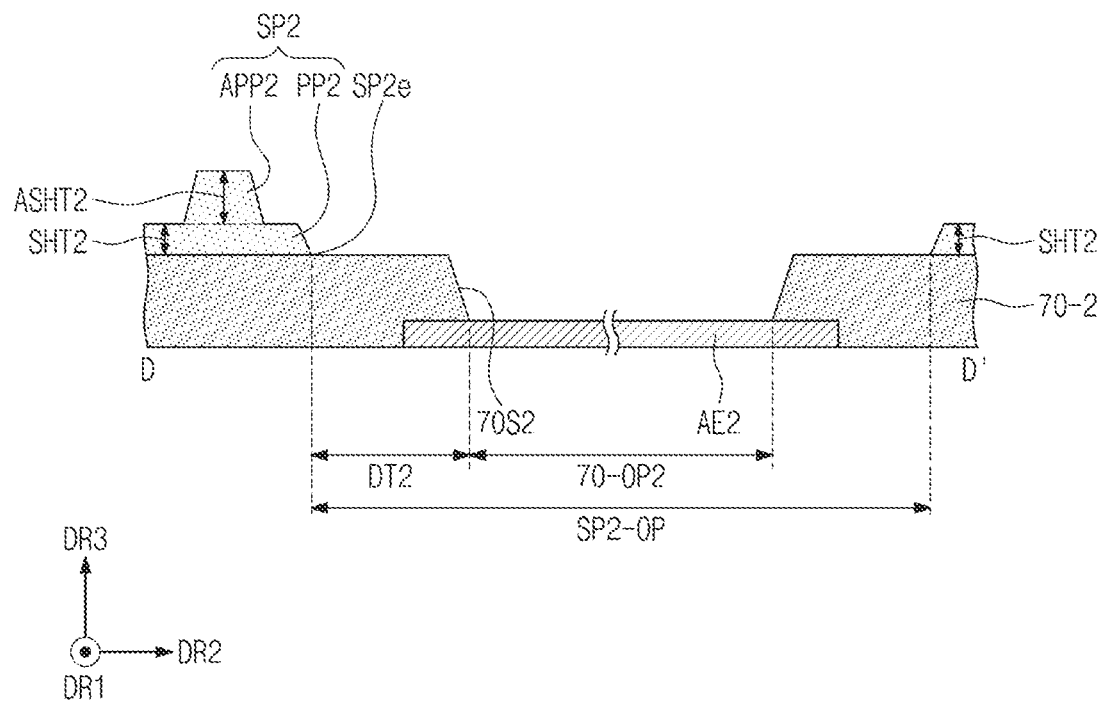
FIG. 9A is a cross-sectional view of a display panel according to an embodiment of the present disclosure.

FIG. 8 is a plan view of a display panel 100 according to an embodiment of the present disclosure. FIG. 9A is a cross-sectional view of a display panel 100 according to an embodiment of the present disclosure. FIG. 8 shows a second pixel defining portion 70-2 and the second spacer SP2 disposed in the second region DA2 (see FIG. 2C). FIG. 9A is a cross-sectional view illustrating a cross-section taken along line D-D' of FIG. 8. FIG. 9A shows the second pixel electrode AE2, the second pixel defining portion 70-2, and the second spacer SP2.

Referring to FIGS. 8 and 9A, the second spacer SP2 may include a second protruding portion PP2 (e.g., a second lower protruding portion) having a second height SHT2 and a second additional protruding portion APP2 which protrudes from a top surface of the second protruding portion PP2. The second protruding portion PP2 and the second additional protruding portion APP2 may contain the same material as each other and may have an integral shape. The second edge SP2e of the second spacer SP2 may be an edge of the second protruding portion PP2. In an embodiment, for example, within the second spacer SP2, a second upper protruding portion (e.g., the second additional protruding portion APP2) may be provided in plural including a plurality of second upper protruding portions spaced apart from each other along the pixel defining layer.

The second protruding portion PP2 may have a shape similar to that of the second pixel defining portion 70-2. In an embodiment, for example, a second spacer opening SP2-OP overlapping the second opening 70-OP2 may be defined in the second protruding portion PP2. The second spacer opening SP2-OP may be larger than the second opening 70-OP2.

When the first opening 70-OP1 (see FIG. 6) and the second opening 70-OP2 have the same size, the second spacer opening SP2-OP may be larger than the first spacer opening SP1-OP (see FIG. 6).

A ratio of an area of a portion of the second pixel defining portion 70-2 covered by the second spacer SP2, to a total area of the second pixel defining portion 70-2 may be less than a predetermined value. In an embodiment, for example, the predetermined value may be about 50%. That is, less than about 50% of a top surface of the second pixel defining portion 70-2 may be covered by the second spacer SP2.

The thickness of the second organic encapsulation layer 142-2 (see FIG. 5A) provided in the second region DA2 (see FIG. 5A) is smaller than the thickness of the first organic encapsulation layer 142-1 (see FIG. 5A) provided in the first region DA1 (see FIG. 4). In this case, there is a high possibility that the stain defects may occur in the second organic encapsulation layer 142-2 (see FIG. 5A) having the relatively small thickness. According to the embodiment of the present disclosure, when the second spacer SP2 reduces the covered area of the second pixel defining portion 70-2 and increases an exposed area of the second pixel defining portion 70-2 to outside the second spacer SP2, flatness of a top surface of the second organic encapsulation layer 142-2 (see FIG. 5A) may be improved, and thus, the stain defects may be reduced or eliminated.

The second height SHT2 of the second protruding portion PP2 may be smaller than the first height SHT1 (see FIG. 7) of the first protruding portion PP1 (see FIG. 7). In this case, the flatness of the top surface of the second organic encapsulation layer 142-2 (see FIG. 5A) may be further improved.

A maximum height of the first spacer SP1 (see FIG. 7) and a maximum height of the second spacer SP2 may be substantially the same. Therefore, as the first height SHT1 (see FIG. 7) of the first protruding portion PP1 (see FIG. 7) is different from the second height SHT2 of the second protruding portion PP2 (e.g., larger than the second height SHT2), a third height ASHT1 (see FIG. 7) of the first additional protruding portion APP1 (see FIG. 7) may be smaller than a fourth height ASHT2 of the second additional protruding portion APP2.

Figure 9B:
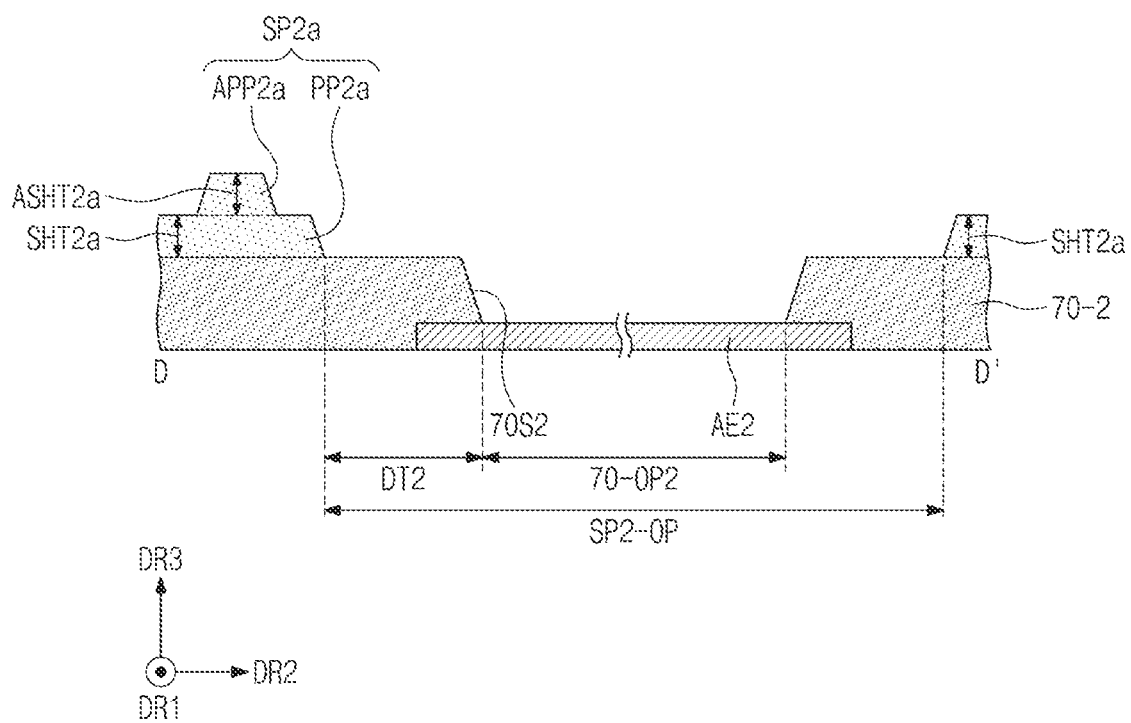
FIG. 9B is a cross-sectional view of a display panel according to an embodiment of the present disclosure.

FIG. 9B is a cross-sectional view of a display panel 100 according to an embodiment of the present disclosure. FIG. 9B is a cross-sectional view illustrating a cross-section taken along line D-D' of FIG. 8. In a description of FIG. 9B, only portions different from those of FIG. 9A will be described.

Referring to FIGS. 8 and 9B, a second spacer SP2a may include a second protruding portion PP2a having a second height SHT2a, and a second additional protruding portion APP2a which protrudes from a top surface of the second protruding portion PP2a. The second height SHT2a of the second protruding portion PP2a may be substantially the same as the first height SHT1 (see FIG. 7) of the first protruding portion PP1 (see FIG. 7), and a fourth height ASHT2a of the second additional protruding portion APP2a may be substantially the same as a third height ASHT1 (see FIG. 7) of the first additional protruding portion APP1 (see FIG. 7).

According to the embodiment of the present disclosure, a ratio of an area of the second pixel defining portion 70-2 covered by the second spacer SP2a to the total area of the second pixel defining portion 70-2, may be smaller than the ratio of the area of the first pixel defining portion 70-1 (see FIG. 6) covered by the first spacer SP1 (see FIG. 6) to the total area of the first pixel defining portion 70-1 (see FIG. 6). In this case, the flatness of the top surface of the second organic encapsulation layer 142-2 (see FIG. 5A) may be improved, and thus, the stain defects may be reduced or eliminated.

Figure 10:
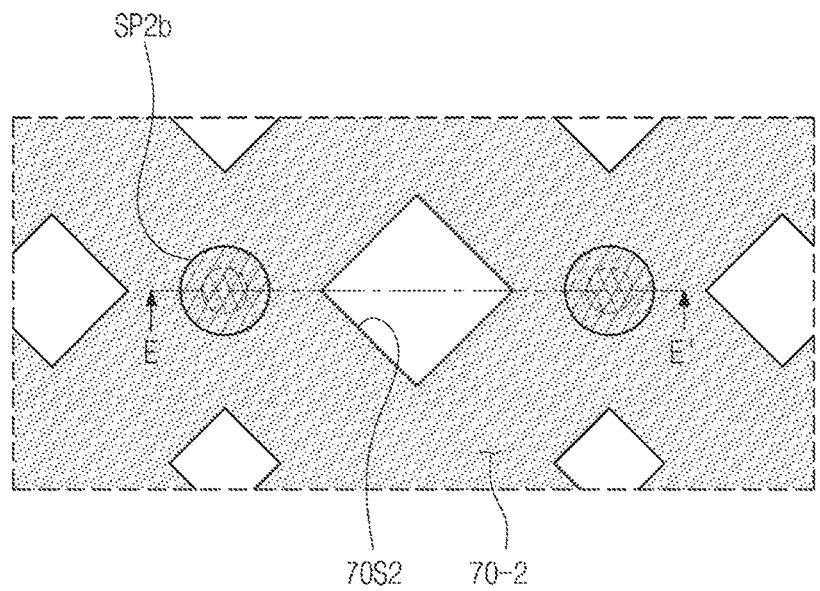
FIG. 10 is a plan view of a display panel according to an embodiment of the present disclosure.
Figure 11:
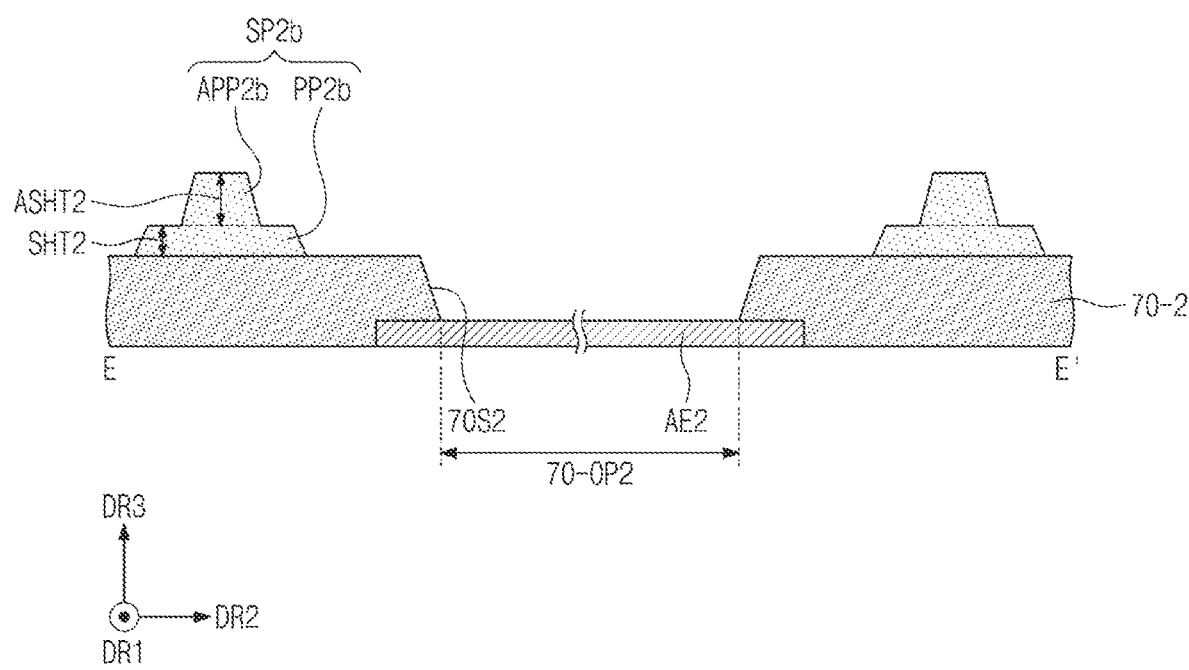
FIG. 11 is a cross-sectional view of a display panel according to an embodiment of the present disclosure.

FIG. 10 is a plan view of a display panel 100 according to an embodiment of the present disclosure. FIG. 11 is a cross-sectional view of a display panel 100 according to an embodiment of the present disclosure. FIG. 10 shows the second pixel defining portion 70-2 and a second spacer SP2b disposed in the second region DA2 (see FIG. 2C). FIG. 11 is a cross-sectional view illustrating a cross-section taken along line E-E' of FIG. 10. FIG. 11 shows the second pixel electrode AE2, the second pixel defining portion 70-2, and the second spacer SP2b provided in plural including a plurality of second spacers SP2b.

Each of the second spacers SP2b may include a second protruding portion PP2b having the second height SHT2 and a second additional protruding portion APP2b which protrudes from a top surface of the second protruding portion PP2b. The second spacers SP2b may be arranged to be spaced apart from each other. The second spacers SP2b may be a discrete pattern on the pixel defining film 70.

Although each of the second protruding portion PP2b and the second additional protruding portion APP2b has been illustrated as having a circular shape on a plane as an example, the present disclosure is not particularly limited thereto. In an embodiment, for example, each of the second protruding portion PP2b and the second additional protruding portion APP2b may have various shapes, such as the polygonal shape, the elliptical shape, and the irregular shape.

According to the embodiment of the present disclosure, a ratio of an area of the second pixel defining portion 70-2 covered by the second spacer SP2b to the total area of the second pixel defining portion 70-2, may be smaller than the ratio of the area of the first pixel defining portion 70-1 (see FIG. 6) covered by the first spacer SP1 (see FIG. 6) to the total area of the first pixel defining portion 70-1 (see FIG. 6). In this case, the flatness of the top surface of the second organic encapsulation layer 142-2 (see FIG. 5A) may be improved, and thus, the stain defects may be reduced or eliminated.

Figure 12:
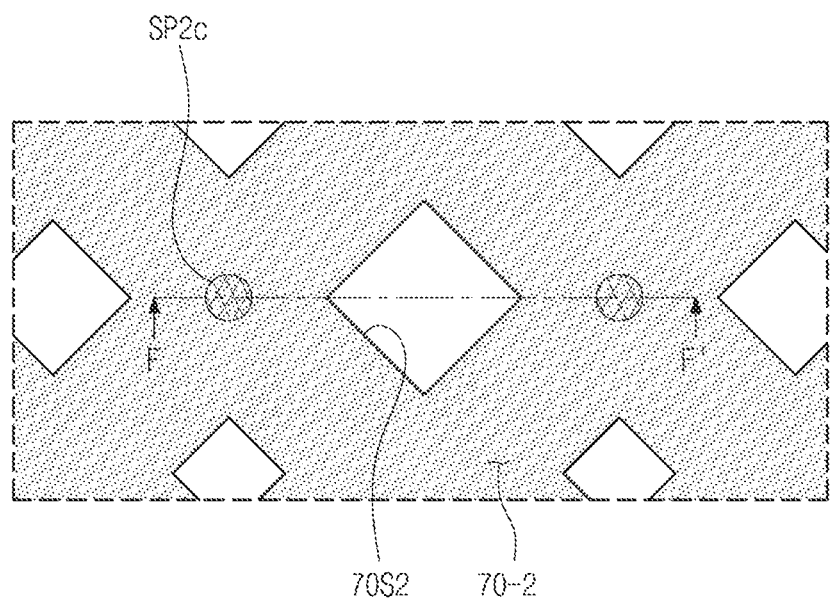
FIG. 12 is a plan view of a display panel according to an embodiment of the present disclosure.
Figure 12:
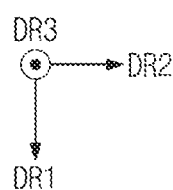
Figure 13:
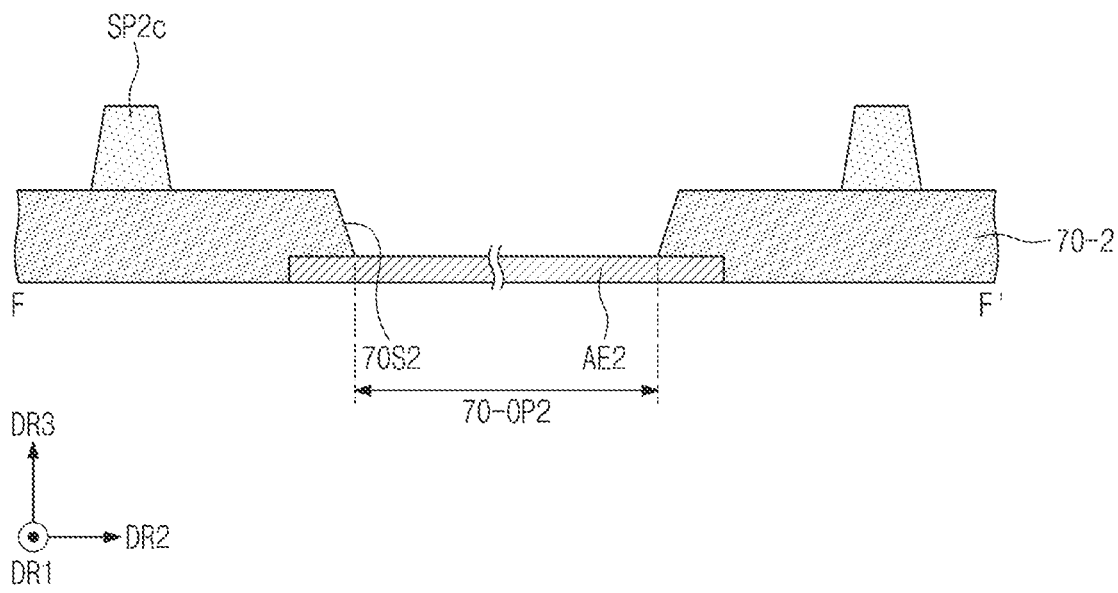
FIG. 13 is a cross-sectional view of a display panel according to an embodiment of the present disclosure.

FIG. 12 is a plan view of a display panel 100 according to an embodiment of the present disclosure. FIG. 13 is a cross-sectional view of a display panel 100 according to an embodiment of the present disclosure. FIG. 12 shows the second pixel defining portion 70-2 and a second spacer SP2c disposed in the second region DA2 (see FIG. 2C). FIG. 13 is a cross-sectional view illustrating a cross-section taken along line F-F' of FIG. 12. FIG. 13 shows the second pixel electrode AE2, the second pixel defining portion 70-2, and the second spacers SP2c.

The second spacers SP2c may be arranged to be spaced apart from each other. Although each of the second spacers SP2c has been illustrated as having a circular shape on a plane as an example, the present disclosure is not particularly limited thereto. In an embodiment, for example, each of the second spacers SP2c may have various shapes, such as the polygonal shape, the elliptical shape, and the irregular shape.

The second spacer SP2c may be considered as including a lower protruding portion closest to the pixel defining film 70 and an upper protruding portion which is further from the pixel defining film 70 than the lower protruding portion and protrudes in a direction away from the pixel defining film 70, where each of the lower and upper protruding portions define an edge closest to the second opening 70-OP2. As shown in FIG. 13, within the second spacer SP2c, the edges of the lower and upper protruding portions are coplanar (or aligned) with each other and omit a stepped portion (refer to second spacer SP2b in FIG. 11, for example). A total height of the second spacer SP2c may be equal to a sum of the first height SHT1 and the third height ASHT1 (FIG. 7), without being limited thereto.

According to the embodiment of the present disclosure, a ratio of an area of the second pixel defining portion 70-2 covered by the second spacers SP2c to the total area of the second pixel defining portion 70-2, may be smaller than the ratio of the area of the first pixel defining portion 70-1 (see FIG. 6) covered by the first spacer SP1 (see FIG. 6) to the total area of the first pixel defining portion 70-1 (see FIG. 6). In this case, the flatness of the top surface of the second organic encapsulation layer 142-2 (see FIG. 5A) may be improved, and thus, the stain defects may be reduced or eliminated.

Figure 14A:
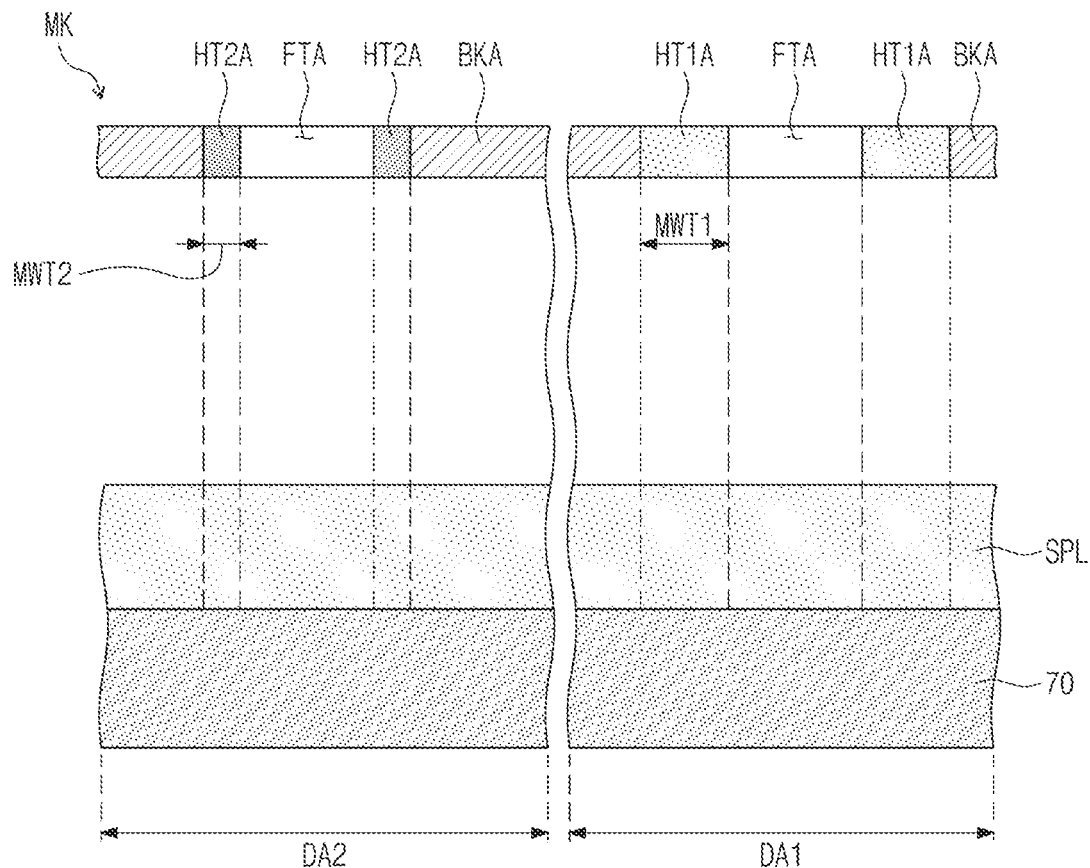
FIGS. 14A and 14B are cross-sectional views illustrating a portion of a method for providing a display panel according to an embodiment of the present disclosure.
Figure 14B:
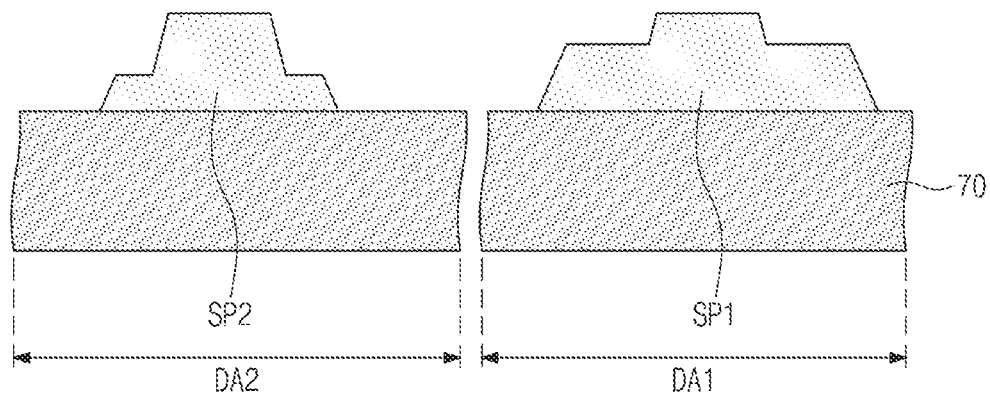

FIGS. 14A and 14B are cross-sectional views illustrating a portion of a method for manufacturing (or providing) a display panel 100 according to an embodiment of the present disclosure.

Referring to FIG. 14A, the pixel defining film 70 is formed. A photosensitive polyimide layer SPL is formed on the pixel defining film 70. Thereafter, a mask MK is aligned above the photosensitive polyimide layer SPL.

In the mask MK, a full-tone region FTA, a first half-tone region HT1A, a second half-tone region HT2A, and a light blocking region BKA are defined. The full-tone region FTA may be a region having the highest transmittance in the mask MK, and the light blocking region BKA may be a region having the lowest transmittance in the mask MK. In an embodiment, for example, the transmittance of the full-tone region FTA may be close to 100%, and the transmittance of the light blocking region BKA may be close to 0%. The full-tone region FTA corresponds to an additional protruding portion (or an upper protruding portion of a respective spacer), the first half-tone region HT1A and the second half-tone region HT2A correspond to the respective protruding portion (or a lower protruding portion) or the respective spacer, and the light blocking region BKA corresponds to an area at which the upper surface of the pixel defining film 70 is exposed to outside the spacer layer.

The first half-tone region HT1A and the second half-tone region HT2A may be regions that transmit a portion of light incident to the photosensitive polyimide layer SPL via the mask MK. A transmittance of each of the first half-tone region HT1A and the second half-tone region HT2A may be higher than that of the light blocking region BKA and lower than that of the full-tone region FTA.

A first mask width MWT1 of the first half-tone region HT1A may be greater than a second mask width MWT2 of the second half-tone region HT2A. The first half-tone region HT1A may be aligned to overlap (or correspond to) the first region DA1, and the second half-tone region HT2A may be aligned to overlap (or correspond to) the second region DA2.

In the state in which the mask MK is aligned, ultraviolet light is irradiated to the photosensitive polyimide layer SPL, via the mask MK. Properties of the photosensitive polyimide layer SPL irradiated with the light are changed, and the photosensitive polyimide layer SPL is patterned through a developing process.

Referring to FIGS. 14A and 14B, the photosensitive polyimide layer SPL is patterned to form the first spacer SP1 and the second spacer SP2. Since the first mask width MWT1 of the first half-tone region HT1A is greater than the second mask width MWT2 of the second half-tone region HT2A, a maximum width of the first spacer SP1 may be greater than a maximum width of the second spacer SP2, in a direction along the pixel defining film 70.

In addition, the transmittance of the first half-tone region HT1A may be higher than that of the second half-tone region HT2A. Accordingly, a height of a portion of the second spacer SP2 formed to correspond to the second half-tone region HT2A may be smaller than a height of a portion of the first spacer SP1 formed to correspond to the first half-tone region HT1A. The portions of the respective spacers corresponding to the various half-tone regions may form a stepped structure with portion of the respective spacers corresponding to the full-tone region FTA, without being limited thereto.

According to the present disclosure, as a ratio of the pixel defining film 70 covered by the first spacer SP1 disposed in the first region DA1 increases, the film lifting phenomenon or the film shape deformation caused by external stress applied to front and side display regions of the display panel 100 may be reduced. As a result, the display device DD (see FIG. 1A) with the improved durability may be provided by including the display panel 100. In addition, the flatness of the top surface of the second organic encapsulation layer 142-2 (see FIG. 5A) may be improved by the second spacer SP2 disposed in the second region DA2, and thus, the stain defects may be reduced or eliminated at the corner display region of the display panel 100.

Hereinabove, the description has been achieved with reference to embodiments of the present disclosure, but those skilled in the art or those having ordinary knowledge in the technical field will understand that the present disclosure may be variously modified and changed within the scope without departing from the spirit and technical region of the present disclosure described in the claims to be described later. Accordingly, the technical scope of the present disclosure should not be limited to the content described in the detailed description of the specification, but should be defined by the claims.

As described above, the display panel 100 includes the first region DA1 as including front and side display regions, and the second region DA2 as including a corner display region. The pixel defining film 70 of the display panel 100 may include the first pixel defining portion 70-1 disposed in the first region DA1 and the second pixel defining portion 70-2 disposed in the second region DA2. The ratio of the area of the first pixel defining portion 70-1 covered by the first spacer SP1 to the total area of the first pixel defining portion 70-1, may be greater than the ratio of the area of the second pixel defining portion 70-2 covered by the second spacer SP2 to the total area of the second pixel defining portion 70-2. In this case, the durability of the front and side display regions of the display device DD may be improved by the first spacer SP1 covering the relatively large area of the pixel defining layer, and the stain defects at the corner display region of the display device DD may be reduced by the second spacer SP2 covering the relatively small area of the pixel defining layer.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:
1. An electronic device comprising:
  a display device comprising:
    an outer edge defining a corner of the display device;
    a front surface display region having a corner facing the corner of the display device and a first light emitting element which includes a first pixel electrode;
    a corner display region which extends bent from the corner of the front surface display region to the corner of the display device, the corner display region having a second light emitting element which includes a second pixel electrode;
    a pixel defining layer in the front surface display region and in the corner display region, the pixel defining layer including:
      a first sidewall defining a first opening of the pixel defining layer which corresponds to the first pixel electrode, and
      a second sidewall defining a second opening of the pixel defining layer which corresponds to the second pixel electrode,
    a first spacer which is in the front surface display region, protrudes from the pixel defining layer adjacent to the first opening and includes a first edge closest to the first opening; and
    a second spacer which is in the corner display region, protrudes from the pixel defining layer adjacent to the second opening, and includes a second edge closest to the second opening,
  wherein among the front surface display region and the corner display region, a distance between the first sidewall of the pixel defining layer and the first edge of the first spacer in the front surface display region is smaller than a distance between the second sidewall of the pixel defining layer and the second edge of the second spacer in the corner display region.

2. The electronic device of claim 1, wherein the pixel defining layer further includes:
a first total area corresponding to the front surface display region, and
a second total area corresponding to the corner display region,
areas of the first spacer and the second spacer which overlap the pixel defining layer, define a first spacer area and a second spacer area, respectively, and
among the front surface display region and the corner display region, a ratio of the first spacer area to the first total area in the front surface display region is greater than a ratio of the second spacer area to the second total area in the corner display region.

3. The electronic device of claim 2, wherein the first spacer includes:
a first lower protruding portion which defines the first edge of the first spacer, and
a first upper protruding portion which extends from the first lower protruding portion and in a direction away from the pixel defining layer.

4. The electronic device of claim 3, wherein
the first lower protruding portion of the first spacer defines a first spacer opening of the first spacer which corresponds to the first opening of the pixel defining layer, and
the first spacer opening of the first spacer is larger than the first opening of the pixel defining layer.

5. The electronic device of claim 4, wherein the second spacer includes:
a second lower protruding portion which defines the second edge of the second spacer, and
a second upper protruding portion which extends from the second lower protruding portion and in the direction away from the pixel defining layer.

6. The electronic device of claim 5, wherein
the first lower protruding portion of the first spacer has a first height,
the second lower protruding portion of the second spacer has a second height, and
the second height is smaller than the first height.

7. The electronic device of claim 5, wherein
the second lower protruding portion of the second spacer defines a second spacer opening of the second spacer which corresponds to the second opening of the pixel defining layer, and
the second spacer opening of the second spacer is larger than the second opening of the pixel defining layer.

8. The electronic device of claim 7, wherein the second spacer opening of the second spacer is larger than the first spacer opening of the first spacer.

9. The electronic device of claim 5, wherein
within the first spacer, the first upper protruding portion is provided in plural including a plurality of first upper protruding portions spaced apart from each other along the pixel defining layer, and
within the second spacer, the second upper protruding portion is provided in plural including a plurality of second upper protruding portions spaced apart from each other along the pixel defining layer.

10. The electronic device of claim 3, wherein the second spacer is provided in plural including a plurality of second spacers spaced apart from each other along the pixel defining layer.

11. The electronic device of claim 10, wherein
the first lower protruding portion of the first spacer has a first height,
each of the plurality of second spacers has a height, and
the height of each of the plurality of second spacers is greater than the first height of the first lower protruding portion of the first spacer.

12. The electronic device of claim 1, wherein within the display device:
the front surface display region further includes a first side and a second side meeting at the corner of the front surface display region,
a first region includes the front surface display region, a first side surface display region extended bent from the first side of the front surface display region, and a second side surface display region extended bent from the second side of the front surface display region,
the corner display region is between the first side surface display region and the second side surface display region in a direction along the outer edge of the display device, and
among the first region and the second region, a distance between the first sidewall of the pixel defining layer and the first edge of the first spacer in the first side surface display region and the second side surface display region is smaller than the distance between the second sidewall of the pixel defining layer and the second edge of the second spacer in the corner display region.

13. The electronic device of claim 1, wherein the display device further comprises:
a first dam in the front surface display region;
a plurality of second dams in the corner display region;
a first organic encapsulation layer in the front surface display region and adjacent to the first dam; and
a plurality of second organic encapsulation layers in the corner display region and adjacent to the plurality of second dams, respectively.

14. The electronic device of claim 13, wherein
each of the first organic encapsulation layer and the plurality of second organic encapsulation layers has a thickness, and
the thickness of the first organic encapsulation layer is greater than the thickness of each of the plurality of second organic encapsulation layers.

15. The electronic device of claim 1, further comprising:
an anti-reflection layer on the display device, the anti-reflection layer including:
a partitioned layer defining a plurality of partitioning openings respectively corresponding to the first opening and the second opening of the pixel defining layer, and
a plurality of color filters respectively corresponding to the plurality of partitioning openings; and
a sensor layer which is between the display device and the anti-reflection layer and senses an external input.

16. An electronic device comprising:
a display device including:
an outer edge defining a corner of the display device;
a first region including:
a front surface display region having a first side meeting a second side at a corner of the front surface display region,
a first side surface display region extended bent from a first side of the front surface display region, and
a second side surface display region extended bent from a second side of the front surface display region; and a corner display region which extends bent from the corner of the front surface display region to the corner of the display device, and is between the first side surface display region and the second side surface display region in a direction along the outer edge of the display device, and a display panel comprising:
- a first light emitting element in the first region and including a first pixel electrode;
- a second light emitting element in the corner display region and including a second pixel electrode;
- a pixel defining layer in which a first opening and a second opening are defined corresponding to the first pixel electrode and the second pixel electrode, respectively; the pixel defining layer including:
  - a first total area in the first region, and
  - a second total area in the corner display region;
- a first spacer which is in the front display region and overlaps the pixel defining layer to define a first spacer area; and
- a second spacer which is in the corner display region and overlaps the pixel defining layer to define a second spacer area,
- wherein among the front display region and the corner display region, a ratio of the first spacer area to the first total area in the front surface display region is greater than a ratio of the second spacer area to the second total area in the corner display region.

17. The electronic device of claim 16, wherein the first spacer includes:
- a first lower protruding portion defining a first spacer opening which corresponds to the first opening of the pixel defining layer and is larger than the first opening, and
- a first upper protruding portion which extends from the first lower protruding portion and in a direction away from the pixel defining layer.

18. The electronic device of claim 17, wherein the second spacer includes:
- a second lower protruding portion defining a second spacer opening which corresponds to the second opening of the pixel defining layer and is larger than the second opening, and
- a second upper protruding portion which extends from the second lower protruding portion and in the direction away from the pixel defining layer.

19. The electronic device of claim 18, wherein
the first lower protruding portion of the first spacer has a first height,
the second lower protruding portion of the second spacer has a second height, and
the second height is smaller than the first height.

20. The electronic device of claim 16, wherein the display device further comprises:
- a first dam in the first region;
- a plurality of second dams in the corner display region;
- a first organic encapsulation layer which is in the first region, is adjacent to the first dam and has a thickness; and
- a plurality of second organic encapsulation layers in the corner display region, is adjacent to the plurality of second dams, respectively, and each of the plurality of second organic encapsulation layers has a thickness,
- wherein the thickness of the first organic encapsulation layer is greater than the thickness of each of the plurality of second organic encapsulation layers.

* * * * *